(12) United States Patent
Yuenyongsgool et al.

(10) Patent No.: US 12,381,546 B2
(45) Date of Patent: Aug. 5, 2025

(54) SYSTEM AND METHOD FOR CONFIGURING COORDINATED PWM GENERATORS

(71) Applicant: Microchip Technology Incorporated, Chandler, AZ (US)

(72) Inventors: Yong Yuenyongsgool, Gilbert, AZ (US); Andreas Reiter, Feldkirchen-Westerham (DE); Stephen Bowling, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 56 days.

(21) Appl. No.: 18/540,509

(22) Filed: Dec. 14, 2023

(65) Prior Publication Data

US 2024/0204763 A1 Jun. 20, 2024

Related U.S. Application Data

(60) Provisional application No. 63/432,894, filed on Dec. 15, 2022.

(51) Int. Cl.
| | |
|---|---|
| H03K 7/08 | (2006.01) |
| H03K 3/70 | (2006.01) |
| H03K 7/10 | (2006.01) |

(52) U.S. Cl.
CPC .............. *H03K 7/08* (2013.01); *H03K 3/70* (2013.01); *H03K 7/10* (2013.01)

(58) Field of Classification Search
CPC .............. H03K 7/08; H03K 7/10; H03K 7/70
See application file for complete search history.

(56) References Cited

U.S. PATENT DOCUMENTS

| | | | |
|---|---|---|---|
| 2005/0213654 A1 | 9/2005 | Figoli | 327/238 |
| 2005/0242858 A1* | 11/2005 | Figoli | H03K 7/08 327/175 |
| 2009/0184742 A1 | 7/2009 | Kris | 237/160 |
| 2011/0298514 A1* | 12/2011 | Hopkins | H03K 7/08 327/176 |

OTHER PUBLICATIONS

Partial International Search Report and Invitation to Pay Additional Fees, Application No. PCT/US2023/084202, 14 pages, May 7, 2024.

(Continued)

*Primary Examiner* — Jeffrey M Shin
(74) *Attorney, Agent, or Firm* — SLAYDEN GRUBERT BEARD PLLC

(57) ABSTRACT

A system and method is provided including a first pulse width modulation (PWM) generator circuit including a first timer to generate a first cycle count, a first configuration register to define characteristics of a first electrical pulse to be generated, and a trigger cycle count specifying a timing of a first trigger signal, and a first load enable input to load a new configuration value into the first configuration register, a second PWM generator circuit including a second timer to generate a second cycle count, a second configuration register to define characteristics of a second electrical pulse to be generated, a second load enable input to load a new configuration value into the second configuration register, and a load enable selector to selectively drive the second load enable input based on the first trigger signal.

20 Claims, 18 Drawing Sheets

(56) References Cited

OTHER PUBLICATIONS

International Search Report and Written Opinion, Application No. PCT/US2023/084202, 21 pages, Jun. 28, 2024.
Microchip Technoloy Incorporated, "HRPWM with Fine Edge Placement: dsPIC33/PIC24 Family Reference Manual," URL: https://ww1.microchip.com/downloads/en/DeviceDoc/dsPIC33-PIC24-FRM,-HRPWM-with-Fine-Edge-Placement-DS70005320C.pdf, 138 pages, © 2019.

\* cited by examiner

SYSTEM AND METHOD FOR CONFIGURING COORDINATED PWM GENERATORS

RELATED APPLICATIONS

This application claims priority to U.S. provisional application Ser. No. 63/432,894, filed on Dec. 15, 2022, the disclosure of which is incorporated by reference in its entirety for all purposes.

FIELD OF THE INVENTION

The present application relates to pulsed-width modulation (PWM) devices and, more particularly, to configuring coordinated PWM generators.

BACKGROUND

To control PWM signal generation, a control loop is often used. With some PWM applications that use 4-16 separate PWM signal generators running in parallel, inventors of examples of the present disclosure have discovered that the demand for computation is very high for control of such generators.

Operation of complex power converter topologies, such as multiphase LLC resonant converters with synchronous rectifier stages, require a very specific update scheme of timing values, which are lead by one channel and followed by all others. Update triggers must be daisy-chained and stay within a fixed, robust and reliable sequence. Even if the leading trigger overruns its time base, the following triggers to the daisy-chained PWM generators and related configuration updates must be rolled out in the sequence specified by the microprocessor.

Flexibility of existing PWM modules may be limited to standard time-based triggers.

Examples of the present disclosure may address these issues through increased efficiency in PWM signaling. Such efficiency may include higher-level, intelligent synchronization and updated trigger management.

SUMMARY

In some examples, a circuit is provided including a first pulse width modulation (PWM) generator circuit including a first timer to generate a first cycle count, a first configuration register to define characteristics of a first electrical pulse to be generated, and a trigger cycle count specifying a timing of a first trigger signal, and a first load enable input to load a new configuration value into the first configuration register; a second PWM generator circuit including a second timer to generate a second cycle count, a second configuration register to define characteristics of a second electrical pulse to be generated, a second load enable input to load a new configuration value into the second configuration register; and a load enable selector to selectively drive the second load enable input based on the first trigger signal. In certain examples, the circuit includes a buffer to define characteristics of a third electrical pulse to be generated wherein upon assertion of the second load enable input, the second PWM generator circuit to load the second configuration register from the buffer contents, and load the buffer with characteristics of a fourth electrical pulse to be generated. In certain examples, the circuit includes a first buffer to define characteristics of a third electrical pulse to be generated, a second buffer to define characteristics of a fourth electrical pulse to be generated, wherein upon assertion of the second load enable input, the second PWM generator circuit to load the second configuration register from the first buffer contents, load the first buffer contents from the second buffer, and load the second buffer with characteristics of a fifth electrical pulse to be generated. In some examples the characteristics of the second electrical pulse to be generated includes a specification in clock cycles of a period of the second electrical pulse, a timing in clock cycles of a rising edge of the second electrical pulse, and a timing in clock cycles of a falling edge of the second electrical pulse. In certain examples the circuit includes a first configuration buffer to load the first configuration register upon assertion of the first load enable input, and a second configuration buffer to load the second configuration register upon assertion of the second load enable input. In certain examples, the circuit includes the first configuration register to define a timing of a second trigger signal, and the load enable selector to selectively drive the second load enable input based on the second trigger signal. In certain examples first configuration register defining characteristics of the first electrical pulse to be generated includes a specification of a period of the first electrical pulse, a specification of a phase of the first electrical pulse, a specification of a duty cycle of the first electrical pulse, and a specification of a dead time compensation of the first electrical pulse.

In some examples a circuit is provided including a first PWM generator circuit, including a first timer, a first program enable to enable loading of a first program register, a first trigger input to activate the first timer, and a first plurality of trigger outputs, and a second PWM generator circuit, including a second timer, a second program enable input to enable loading of a second program register, a second trigger input to activate the second timer, and a second trigger input selector for selectively driving the second trigger input based on one of the first plurality of trigger outputs, a first memory access channel to load the first program register, and a second memory access channel to load the second program register. In certain examples, the circuit includes a third PWM generator circuit, including a third timer, a third program enable to enable loading of a third program register, a third trigger input to activate the third timer, and a third trigger input selector for selectively driving the third trigger input based on one of the first plurality of trigger outputs or one of the second plurality of trigger outputs. In certain examples, the first program register defines, a period, a phase, and a duty cycle. In certain examples, first program enable and second program enable may be asserted simultaneously. In some examples, the first program register and the second program register are coupled to the same memory access controller. In certain examples, the first memory access controller to read values from a first buffer into the first program register and the second memory access controller to read values from a second buffer into the second program register.

In some examples, a method is provided including in response to a first load enable signal received at a first PWM generator loading a first configuration register with values defining characteristics of a first electrical pulse to be generated, and a first trigger time, and determining a start time of the first electrical pulse, and in response to a first trigger signal on a first trigger input, enabling a first timer to begin counting, in response to the first timer counting to the first trigger time, generating a first trigger output signal on a first trigger output, in response to the first timer counting to the start time of the first electrical pulse, generating a first electrical pulse, selecting a second load enable input to a second PWM generator from a plurality of selectable inputs including the first trigger output, and in response to a second load enable input signal received at the second load enable input, loading a second configuration register of the second PWM generator with values defining characteristics of a second electrical pulse to be generated. In certain examples, the method includes in response to the first timer counting to a second trigger time, generating a second trigger signal, in response to the second trigger signal, enabling a second timer of the second PWM generator to begin counting. In certain examples, the method includes selecting the first trigger input as the second load enable input to the second PWM generator, and in response to the first trigger input signal, loading the second configuration register with values defining characteristics of a second electrical pulse to be generated. In certain examples, loading the first configuration register receives configuration values from a first buffer and loading the second configuration register receives configuration values from a second buffer. In certain examples, loading the first configuration register receives configuration values from a first direct memory access (DMA) channel and loading the second configuration register receives configuration values from a second DMA channel. In certain examples, the first PWM generator operates on a first period and the second PWM generator operates on a second period, the method including, a processor storing in a memory the values defining the plurality of characteristics of the first electrical pulse to be generated, and the values defining characteristics of a second electrical pulse to be generated, and at the start of the first period, triggering a DMA controller to retrieve the values defining the plurality of characteristics of the first electrical pulse to be generated, at the start of the second period, triggering the DMA controller to retrieve the values defining the characteristics of a second electrical pulse to be generated. In certain examples, triggering the DMA controller in each instance occurs independent of the execution of the processor.

DETAILED DESCRIPTION

Figure 1:
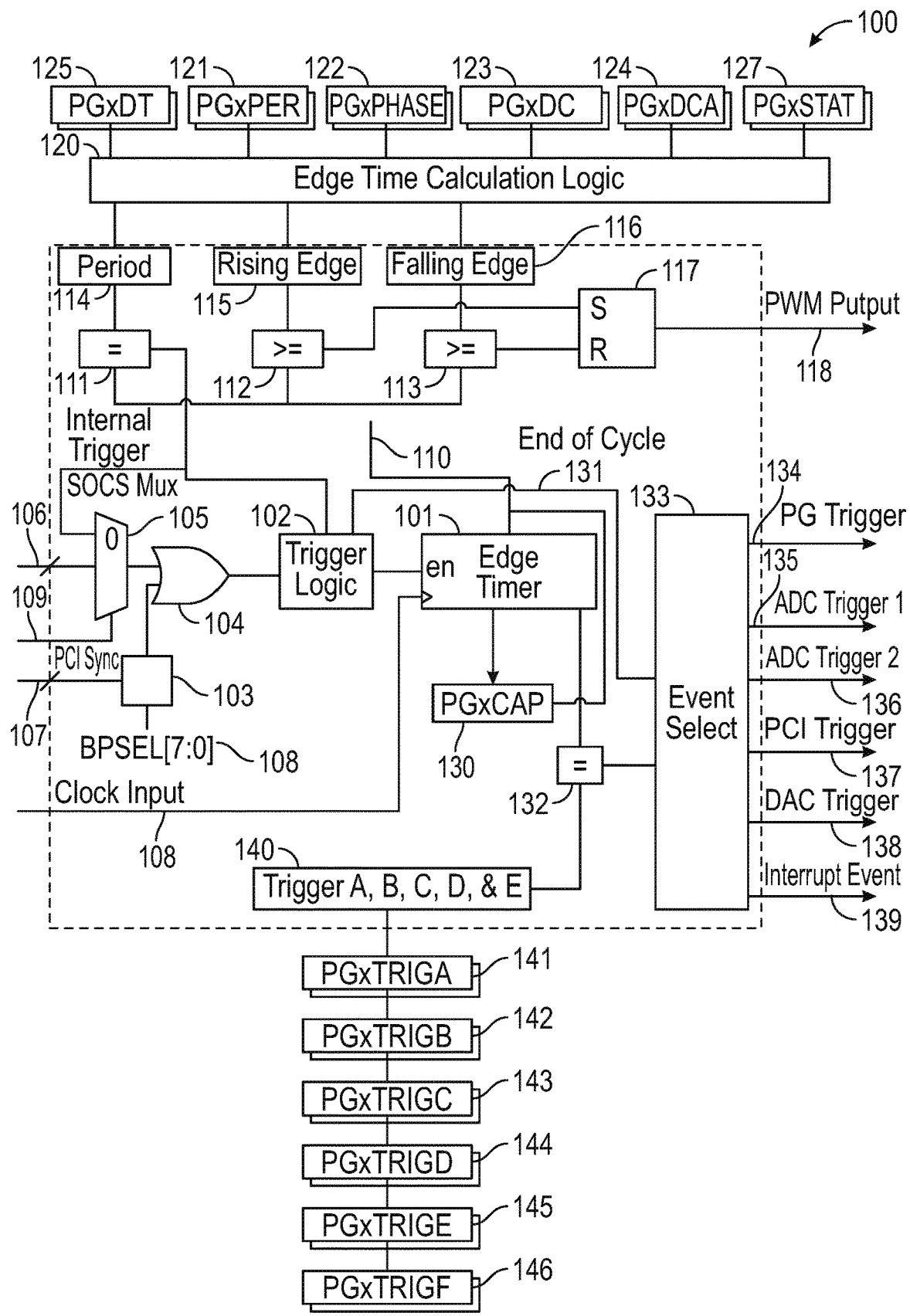
FIG. 1 is an illustration of a PWM generator according to certain examples of the present disclosure.

Examples of the present disclosure may allow a single control loop to support multiple-phase PWM implementations. Examples of the present disclosure may include no restrictions on sharing data values among PWM generators, no timing restrictions on register programming on any of the PWM generators, and no restrictions on total offset among PWM generators.

Examples of the present disclosure may include two independent architectures. These may include pipeline architecture and direct memory access (DMA) assist architecture. A given device might use a single one or both of these architectures. Each architecture may be implemented by analog circuitry, digital circuitry, programmable logic, programmable circuitry, application specific integrated device, field programmable gate array, instructions for execution by a processor, or any suitable combination thereof.

The pipeline architecture takes advantage of one or more added data buffers enabling it to be completely self-contained to achieve the design objectives.

The DMA assist architecture takes advantage of available DMA and memory resources to simplify its design and implementation while also being able to achieve its design objectives.

The pipeline architecture utilizes a three deep FIFO to achieve its objectives. By adding another layer of data buffers, the new data values can be programmed prior to OR after the previously programmed values being used. The hardware is responsible for keeping track of the programming timing (from the control loop) with regard to the PWM timing in proper management of its FIFO's pointer and data movements. This also makes a greater than 360 degree total offset possible. With its added costs, however, this architecture may be more suited to larger and more general purpose devices.

The DMA assist architecture, on the other hand, does not require these additional buffers or design modifications. By timely utilizing already available DMA channels and some pre-allocated internal system memory space, all objectives can be achieved with some added software complexity. This architecture, however, takes away some system resources which may be delayed or unavailable due to competing needs; especially at some critical execution periods (depending on the applications). It may, therefore, be suitable in more specialized devices where more DMA channels are dedicated to the PWM purpose, and bus utilization by other functions is low.

Note that both architecture employs design modifications to make sure the hardware updates are kept in order (of the offset relationships among all of the PWM generators).

Each PWM often requires a dedicated control loop to support it. This significantly increases the demand for CPU intervention, making it difficult or not practical to support multi-phase PWM implementation with high number of PWM generators with a low cost microcontroller or processor.

With the examples of the present disclosure being able to achieve all of its objectives, more computational work can be accomplished with the same amount of performance (i.e., MIPS), thus allowing higher number of generators in multi-phase PWM implementation without having to upgrade to a higher CPU platform.

FIG. 1 is an illustration of a PWM generator according to certain examples of the present disclosure. A PWM generator is a circuit that generates a pulse with a specified rising edge and falling edge. A PWM generator may repeat this pulse in each period of a defined cycle rate or period. PWM generator 100 may be based around edge timer 101. Edge timer 101 provides a current count of clock cycles when enabled. That current count of clock cycles may be used to determine when portions of the PWM generator circuit take actions. Edge timer 101 may be enabled or disabled by a trigger logic 102 fed by trigger inputs (internal and/or external to the PWM generator 100). Trigger logic 102 may receive information about the current cyclic period (from period comparator 111, which is described below) and/or one or more trigger inputs. Selector 103 may receive a set of program control input (PCI) sync signals 107 from sources such as other PWM generator trigger outputs. PCI bypass source selection 108 may select an output of a specific PWM generator to pass to OR gate 104 for input into trigger logic 102. Trigger input selector 105 may select a trigger input, specified by input 109, from sources including an internal trigger driven by period comparator 111, a microprocessor, or other signal lines 106. Other signal lines may include trigger outputs from other PWM generators, or may capture information about, for example, sensor events or external (to the PWM) control signals. For example, a motor controller incorporating PWM generator 100 may receive an input from a user to begin powering the motor.

The PWM generator 100 generates a PWM pulse based on the current count of the edge timer 100. As the edge timer 100 reaches the rising edge count the PWM output is turned on and as the edge timer 100 reaches the falling edge count the PWM output is turned off. In this example, edge timer 101 counts at a rate defined by clock input 108 and provides a current cycle count 110 to comparators 111, 112, and 113 to compare the current cycle count 110 with period register 114, rising edge register 115, and falling edge register 116, respectively. Period comparator 111 determines when the current cycle count 110 has reached the end of the predefined period for PWM generation and feeds trigger logic 102 and may, directly or indirectly, drive end of cycle 131. End of cycle 131 is an output of trigger logic 102. Rising edge comparator 112 determines when the current cycle count 110 is greater or equal to the predetermined rising edge time defined in rising edge register 115. When this condition is true, rising edge comparator 117 asserts the set input of flip flop 117 causing PWM output 118 to be asserted. Falling edge comparator 113 determines when the current cycle count 110 is greater or equal to the predetermined falling edge time defined in falling edge register 116. When this condition is true, calling edge comparator 113 asserts the reset input of flip flop 117 causing the PWM output 118 to be unasserted. Timer capture register 130 may be used to capture the current cycle count 110 of edge timer 101 on the occurrence of a trigger or other event.

The period, rising edge count, and falling edge count may be determined from a set of control inputs set by a microprocessor. Edge time calculation logic 120 may generate values for period register 114, rising edge register 115, and falling edge register 116 based on the following inputs. PGxPER register 121 may define the period in clock cycles. PGxPHASE 122 may define the starting time of the pulse in clock cycles. PGxDC 123 may define a duty cycle, or pulse width, in clock cycles. PGxDCA 124 may define a duty cycle adjustment value. In a duty cycle adjustment mode the edge time calculation logic 120 may add the duty cycle adjustment value from PGxDCA 124 to the end of the duty cycle. In some examples, the pulse of one PWM generator may be delayed to avoid simultaneous switching of power devices controlled by the PWM generators. PGxDT 125 may store a down time adjustment value to be added to rising edge register 115 by edge calculation logic 120 to delay the rising edge of the pulse to avoid simultaneous switching of power devices controlled by the PWM generators. Configuration register PGxSTAT 127 may allow for additional control or programmability of the PWM generator.

In addition to generating PWM output 118, PWM generator 100 also generates one or more trigger signals to, for example, coordinate with other PWM generators 100 and other electrical components in the circuit. Registers 141-146 (labeled PGxTRIGA through PGxTRIGF, respectively) allow a microprocessor to set one or more clock cycle counts to define trigger timing. Trigger register 140 may store a current/active value of these trigger definitions for comparison with current cycle count at comparator 132. For example, if Trigger A has been defined at a particular count, when current cycle time 110 is equal to the Trigger A count a Trigger A signal will be provided to event selector 133. Event selector 133 allows the microprocessor to select which events will be output on various trigger and/or interrupt lines. PG trigger 134 may be connected to a trigger input of the next downstream PWM generator in sequence. ADC Trigger 1 (135) and ADC Trigger 2 (136) may be used to initiate analog to digital conversion sampling. PCI trigger 127 may feed to downstream PWM generators to trigger, for example, an update of configuration settings. DAC Trigger 138 may initiate a digital to analog conversion circuit. Interrupt Event 139 may signal an interrupt to the microprocessor (not shown) to provide feedback to that processor.

In some examples, configuration registers 121-125, 127, and 141-146 may be implemented as buffers with a depth of two levels, in some examples, to provide a working set of configuration registers and a first set of future values to be loaded upon a triggering event. In some examples, an internal trigger, such as one of Trigger A, B, C, D, or E, may be used to trigger a transfer configuration values from the first set of future values into the working set of registers. In some examples, an external trigger such as one of signal lines 106 may trigger a transfer configuration values from the first set of future values into the working set of registers.

In some examples, configuration registers 121-125, 127, and 141-146 may be implemented as buffers with a depth of three levels, in some examples, to provide a working set of configuration registers and a first and second set of future values to be loaded upon a triggering event. In some examples, an internal trigger, such as one of Trigger A, B, C, D, or E, may be used to trigger a transfer configuration values from the first set of future values into the working set of registers and from the second set of future values into the first set. In some examples, an external trigger such as one of signal lines 106 may trigger a transfer configuration values from the first set of future values into the working set of registers and from the second set of future values into the first set.

Daisy-chaining may necessitate that PWM generators use their independent time base using independent edge timers without a master timer. The leading PWM generator may be set for manual update of its timing register. This may require setting an update request bit of PGxSTAT. Depending on configuration, the timing register update will propagate immediately or at the start of the next cycle (as is sometimes recommended).

The daisy-chain trigger PGxTRIGC 143 may be updated with all other registers of that generator. This may change the phase shift towards the next, following PWM generator, which may then apply its individual timing as it unrolls across itself and all other following generators. It may be recommended to disable all other automated PWM update modes in triggered PWM generators. In some examples, new timing values may be written to registers independently and asynchronously to the PWM generation. When the leading PWM generator is set for Start-Of-Cycle (SOC) Update, the update request of this generator may be set at any time, triggering the daisy-chain deployment across all channels.

Conventional power supply circuits are sometimes modified with new FET and other technologies to drive up switch frequencies. More and more switches are used. Thus, the PWM patterns to be generated are becoming more complex and at higher frequencies. Conventional microprocessor control of cascading PWM generators may not be able to update and/or coordinate PWM generators and may max out resources attempting to do so. In some examples of the present disclosure, the software control loop may operate asynchronously with the hardware control. At a moment in time, the PWM channels may be updated with new parameters. The PWM channel new parameters may be added in a pipeline. Every PWM has its own PWM cycle and may set things for other channels. When a first channel is starting a cycle, the update signal may be provided to other channels, which may in turn load their parameters at the start of a new cycle at the next channel.

Figure 2:
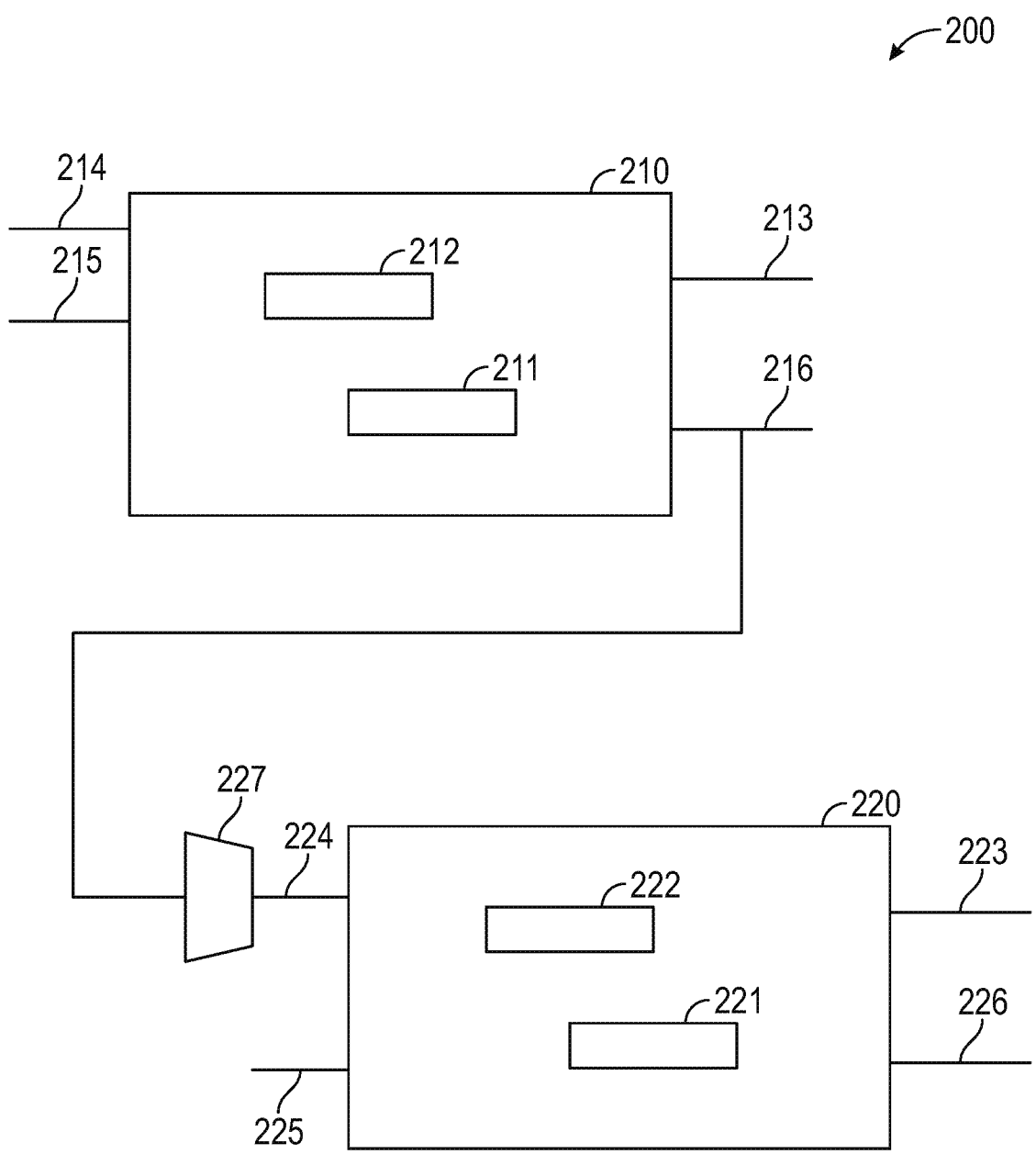
FIG. 2 is an illustration of an arrangement of PWM generators according to certain examples of the present disclosure.

FIG. 2 is an illustration of an arrangement of PWM generators according to certain examples of the present disclosure. Circuit 200 includes two PWM generators. PWM generator 210 is arranged upstream of PWM generator 220. PWM generator 210 includes settings load enable 214 that allows settings to be loaded into configuration register 212 of PWM generator 210 defining characteristics of an electrical pulse to be generated (including the start and end time of that electrical pulse) and a time to generate a trigger. Trigger input 215 may be used to start timer 211 of PWM generator 210. PWM generator 210 generates a PWM signal on PWM output 213. When the current count of timer 211 reaches a predefined trigger time (e.g., defined in configuration register 212) PWM generator 210 may assert trigger output 216.

PWM generator 220 is arranged downstream of PWM generator 210. PWM generator 220 includes settings load enable 224 that allows settings to be loaded into configuration register 222 of PWM generator 220 defining characteristics of an electrical pulse to be generated (including the start and end time of that electrical pulse). Trigger input 225 may be used to start timer 221 of PWM generator 220. PWM generator 220 generates a PWM signal on PWM output 223. When the current count of timer 221 reaches a predefined trigger time (e.g., defined in configuration register 222) PWM generator 210 may assert trigger output 226. Load enable selector 227 may select trigger output 216 as providing the load enable signal.

Figure 3:
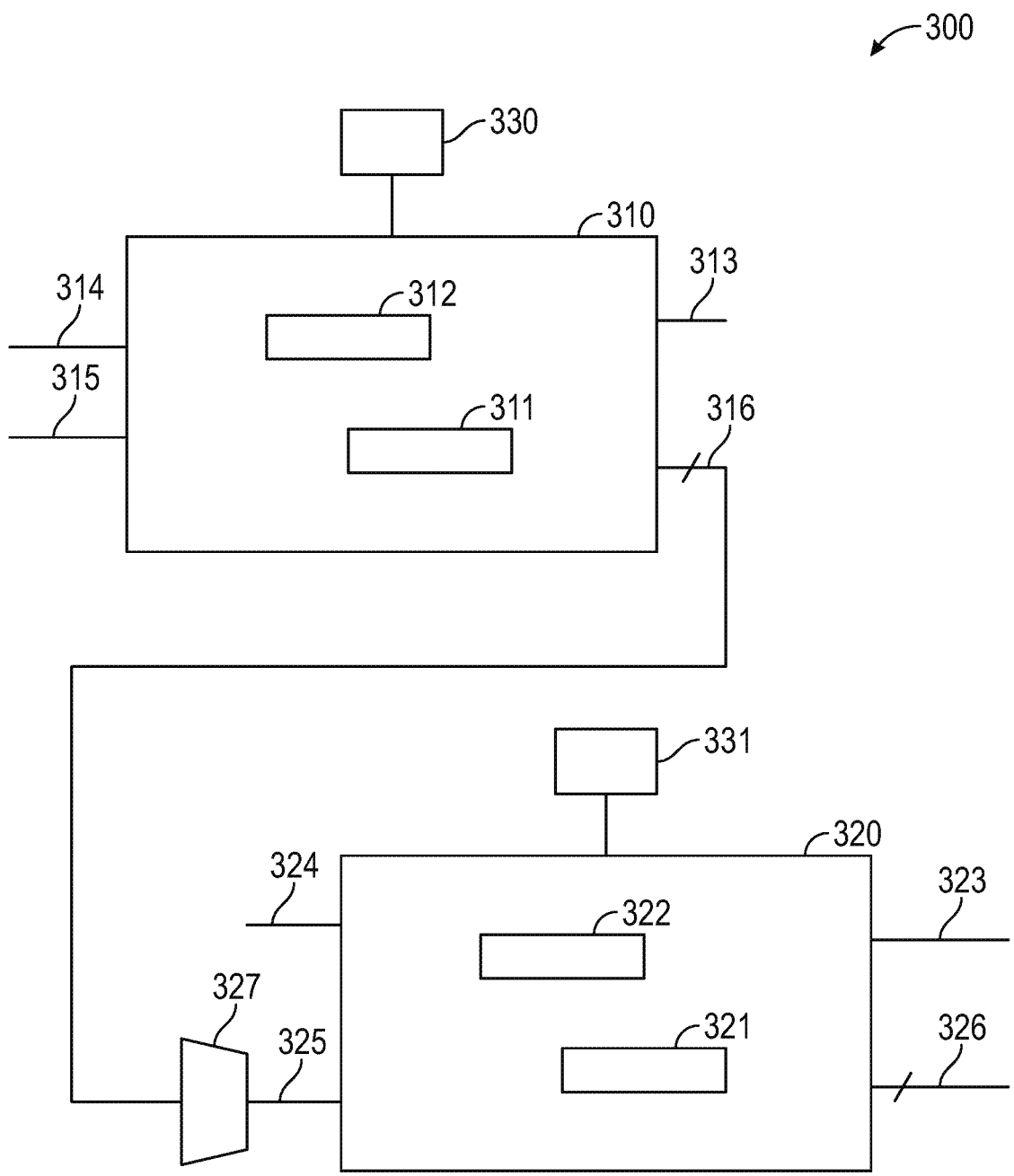
FIG. 3 is an illustration of an arrangement of PWM generators according to certain examples of the present disclosure.

FIG. 3 is an illustration of an arrangement of PWM generators according to certain examples of the present disclosure. Circuit 300 includes two PWM generators. PWM generator 310 is arranged upstream of PWM generator 320. PWM generator 310 includes settings load enable 314 that allows settings to be loaded into configuration register 312 of PWM generator 310. Trigger input 315 may be used to start timer 311 of PWM generator 310. PWM generator 310 generates a PWM signal on PWM output 313. When the current count of timer 311 reaches a predefined trigger time (e.g., defined in configuration register 312) PWM generator 310 may assert trigger output 316.

PWM generator 320 is arranged downstream of PWM generator 310. PWM generator 320 includes settings load enable 324 that allows settings to be loaded into configuration register 322 of PWM generator 320. Trigger input 325 may be used to start timer 321 of PWM generator 320. PWM generator 320 generates a PWM signal on PWM output 323. When the current count of timer 321 reaches a predefined trigger time (e.g., defined in configuration register 322) PWM generator 310 may assert trigger output 326. Trigger selector 327 may select trigger output 316 as providing the trigger input of PWM generator 320.

Buffer 330 and buffer 331 provide temporary storage of configuration register values for PWM generators 310 and 320, respectively. In some examples, buffer 330 and buffer 331 each store one set of configuration register values. In some examples, buffer 330 and buffer 331 each store two sets of configuration register values.

Figure 4:
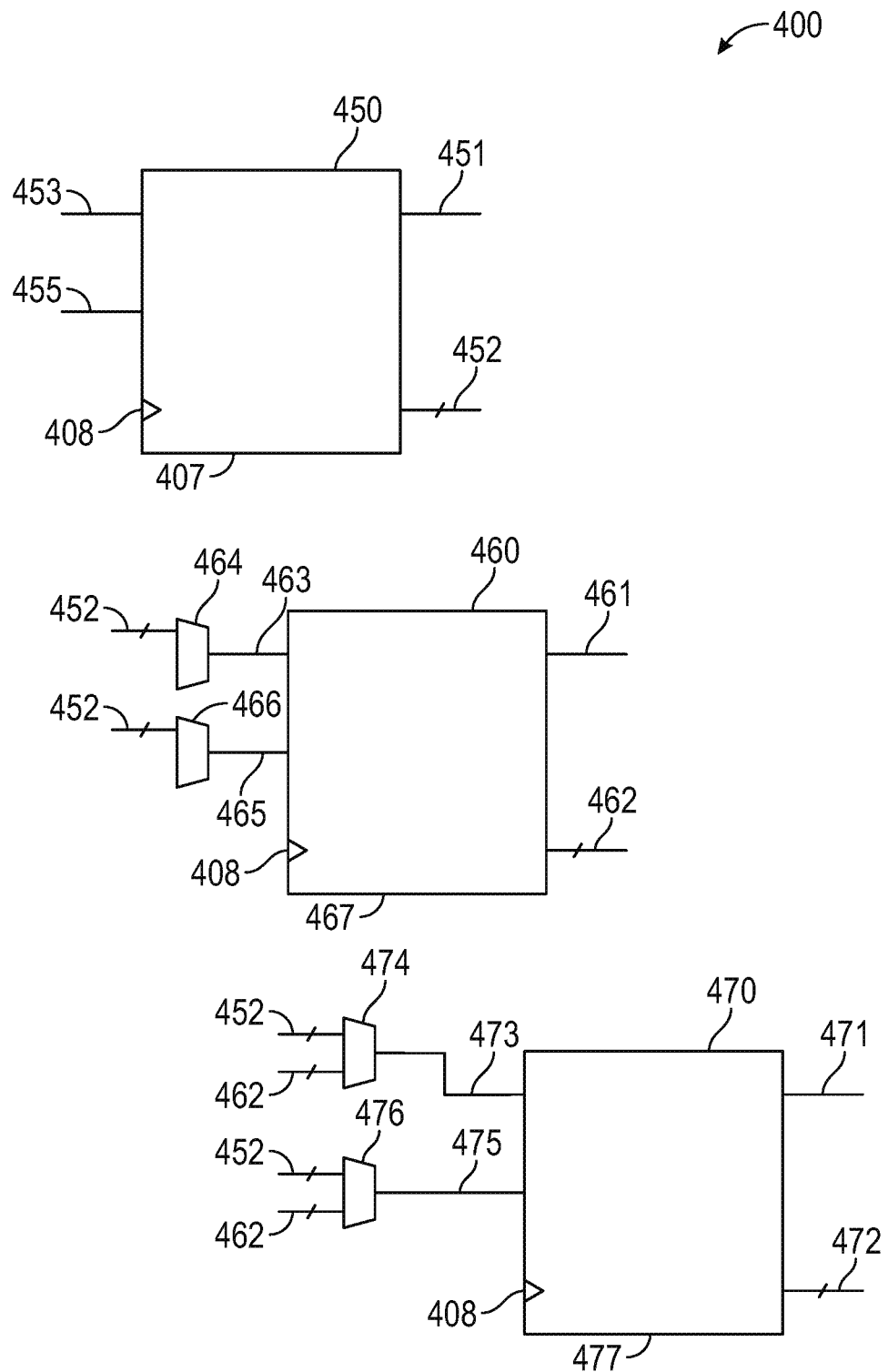
FIG. 4 is an illustration of an arrangement of PWM generators according to certain examples of the present disclosure.

FIG. 4 is an illustration of an arrangement of PWM generators according to certain examples of the present disclosure. Circuit 400 includes three PWM generators. PWM generator 450 is arranged upstream of PWM generator 460. PWM generator 450 includes settings load enable 453 that allows settings to be loaded to configure settings of PWM generator 450. Trigger input 455 may be used to start a timer of PWM generator 450 clocked by clock signal 408. PWM generator 450 generates a PWM signal on PWM output 451. When the current count of the internal timer of PWM generator 450 reaches a predefined trigger time (e.g., defined in configuration settings on assertion of settings load enable 453) PWM generator 450 may assert one of trigger outputs 452. At other predefined trigger times, PWM generator 450 may assert others of trigger outputs 452.

PWM generator 460 is arranged downstream of PWM generator 450. PWM generator 460 includes settings load enable 463 that allows settings to be loaded to configure settings of PWM generator 460. Load enable select 464 may select one of trigger outputs 452 as load enable input 463. Trigger input 465 may be used to start a timer of PWM generator 460 clocked by clock signal 408. Trigger select 466 may be select one of trigger outputs 452 as trigger input 465. In this arrangement, PWM generator 450 may control when PWM generator 460 loads new configuration settings and when PWM generator 460 is triggered. PWM generator 460 generates a PWM signal on PWM output 461. When the current count of the timer of PWM generator 460 reaches a predefined trigger time (e.g., defined in configuration settings on assertion of settings load enable 463) PWM generator 460 may assert trigger output 462. At other predefined trigger times, PWM generator 460 may assert others of trigger outputs 462.

PWM generator 470 is arranged downstream of PWM generator 460. PWM generator 460 includes settings load enable 473 that allows settings to be loaded to configure settings of PWM generator 470. Load enable select 474 may select one of trigger outputs 452 or trigger outputs 462 as load enable input 473. Trigger input 475 may be used to start a timer of PWM generator 470 clocked by clock signal 408. Trigger select 476 may be select one of trigger outputs 452 or one of trigger outputs 462 as trigger input 475. In this arrangement, PWM generator 450 or 460 may control when PWM generator 470 loads new configuration settings and when PWM generator 470 is triggered. PWM generator 470 generates a PWM signal on PWM output 471. When the current count of the timer of PWM generator 470 reaches a predefined trigger time (e.g., defined in configuration settings on assertion of settings load enable 473) PWM generator 470 may assert trigger output 472. At other predefined trigger times, PWM generator 470 may assert others of trigger outputs 472.

In these examples, a microprocessor may provide configuration settings to a set of PWM generators and those PWM generators may operate autonomously or nearly autonomously for one or more cycles.

Figure 5:
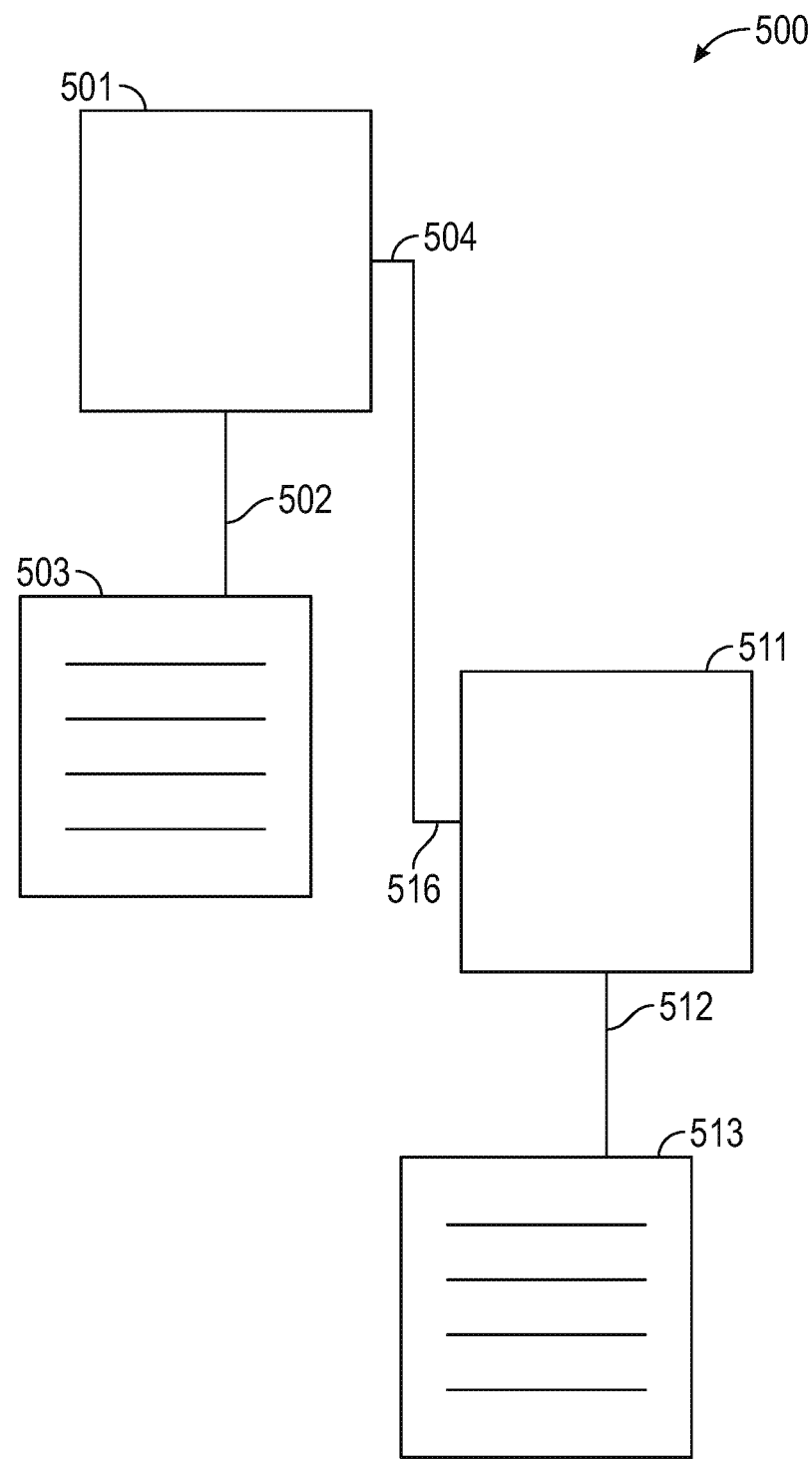
FIG. 5 is an illustration of an arrangement of PWM generators according to certain examples of the present disclosure.

FIG. 5 is an illustration of an arrangement of PWM generators according to certain examples of the present disclosure. Circuit 500 includes PWM generator 501 coupled via data port 502 to memory 503. Memory 503 may be, for example, a buffer, a RAM, or a DMA channel to a main memory. Circuit 500 also includes PWM generator 511 coupled via data port 512 to memory 513. Memory 513 may be, for example, a buffer, a RAM, or a DMA channel to the main memory. In this arrangement, configuration settings may be provided to data ports 502 and 512 simultaneously thus allowing independent configuration of each PWM generator. PWM generator 501 may have a trigger output 504 connected to settings load enable 516 of PWM generator 511. In one example, memories 503 and 513 may each be a buffer with storage for four sets of configuration values. A microprocessor may store multiple sets of configuration settings in memories 503 and 513. PWM generator 501 may load a set of settings from memory 503 and trigger, via trigger output 504, PWM generator 511 to load a set of settings from memory 513. The PWM generators may load new configuration settings for some number of cycles without intervention by the microprocessor, thus freeing up the microprocessor and memory access resources for other tasks.

Figure 6:
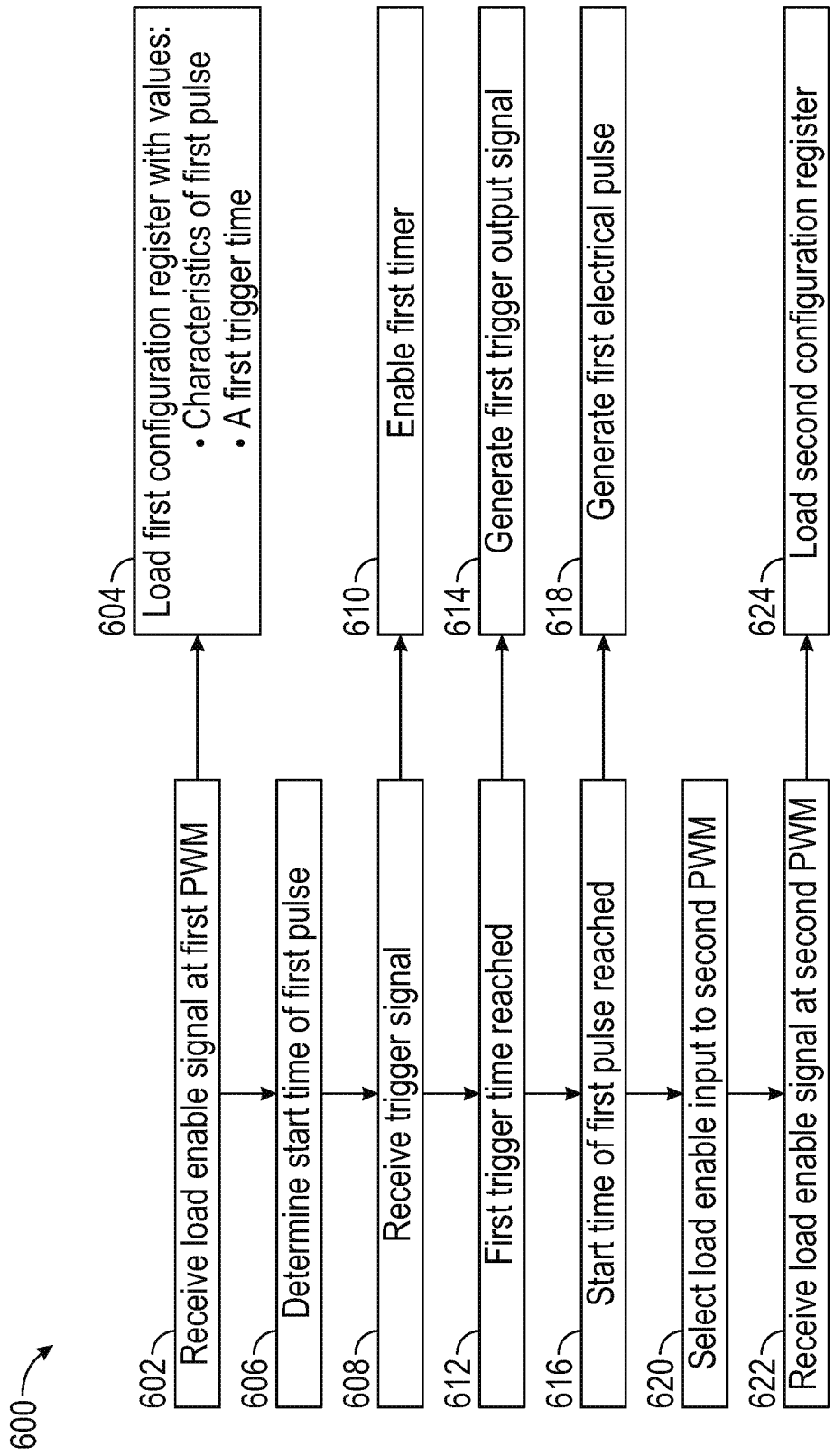
FIG. 6 is an illustration of a method for controlling PWM generators according to certain examples of the present disclosure.

FIG. 6 is an illustration of a method for controlling PWM generators according to certain examples of the present disclosure. Method 600 begins at block 602 where a first PWM generator receives a load enable signal. At block 604, the first PWM generator loads a first configuration register with values including characteristics of a first pulse and a first trigger time. In an example, characteristics of the first pulse may include a period, a rising edge start time, and falling edge time. In another example, characteristics of the first pulse may include a period, phase, and duty cycle. In some examples, the first configuration register may store configuration settings enabling output triggers and selecting input triggers.

At block 606, the first PWM generator determines the start time of a first pulse to be generated. In some examples, block 606 may result in copying a preset start time from configuration settings into an internal register for comparison with the current time of a timer. In some examples, block 606 may include adding the period and a dead time compensation value to determine a start time of the pulse and saving that start time in an internal register.

At block 608, the first PWM generator receives a trigger signal. At block 610, a first timer, i.e., a timer of the first PWM generator is initiated responsive to the trigger signal. The first timer may begin counting at a clock frequency greater than the period of the PWM output. A higher clock frequency may enable higher resolution control over timing of the pulse edges as well as of trigger events.

At block 612, a comparator of the first PWM generator indicates a match of the first trigger time and the current clock cycle count, i.e., a first trigger time is reached. At block 614, responsive to the indication of a match at block 612, i.e., responsive to the first trigger timer reached, the PWM generator generates a first trigger output signal.

At block 616, a comparator of the first PWM generator indicates a match of the start time of the first pulse and the current clock cycle count, i.e., at a start time of the first pulse is reached. At block 618, responsive to the indication of a match at block 616, i.e., responsive to the start time of the first pulse reached, the PWM generator generates a first electrical pulse and maintains that first electrical pulse for a predetermined duration.

At block 620, a selector selects a load enable input to a second PWM generator. In some examples, the load enable input may be coupled to a trigger output of the first PWM generator to provide control by the first PWM generator over when the second PWM generator loads configuration settings.

At block 622, the second PWM generator receives a load enable signal. At block 624, responsive to the load enable signal received at the second PWM generator, the second PWM generator loads a second configuration register, i.e., a configuration register of the second PWM generator, with values including characteristics of a first pulse to be generated by the second PWM generator. In an example, characteristics of the first pulse from the second PWM generator may include a period, a rising edge start time, and falling edge time. In another example, characteristics of the second pulse may include a period, phase, and duty cycle. In some examples, the second configuration register may store configuration settings enabling output triggers and selecting input triggers.

In some examples, blocks are not performed in the order shown.

Figure 7:
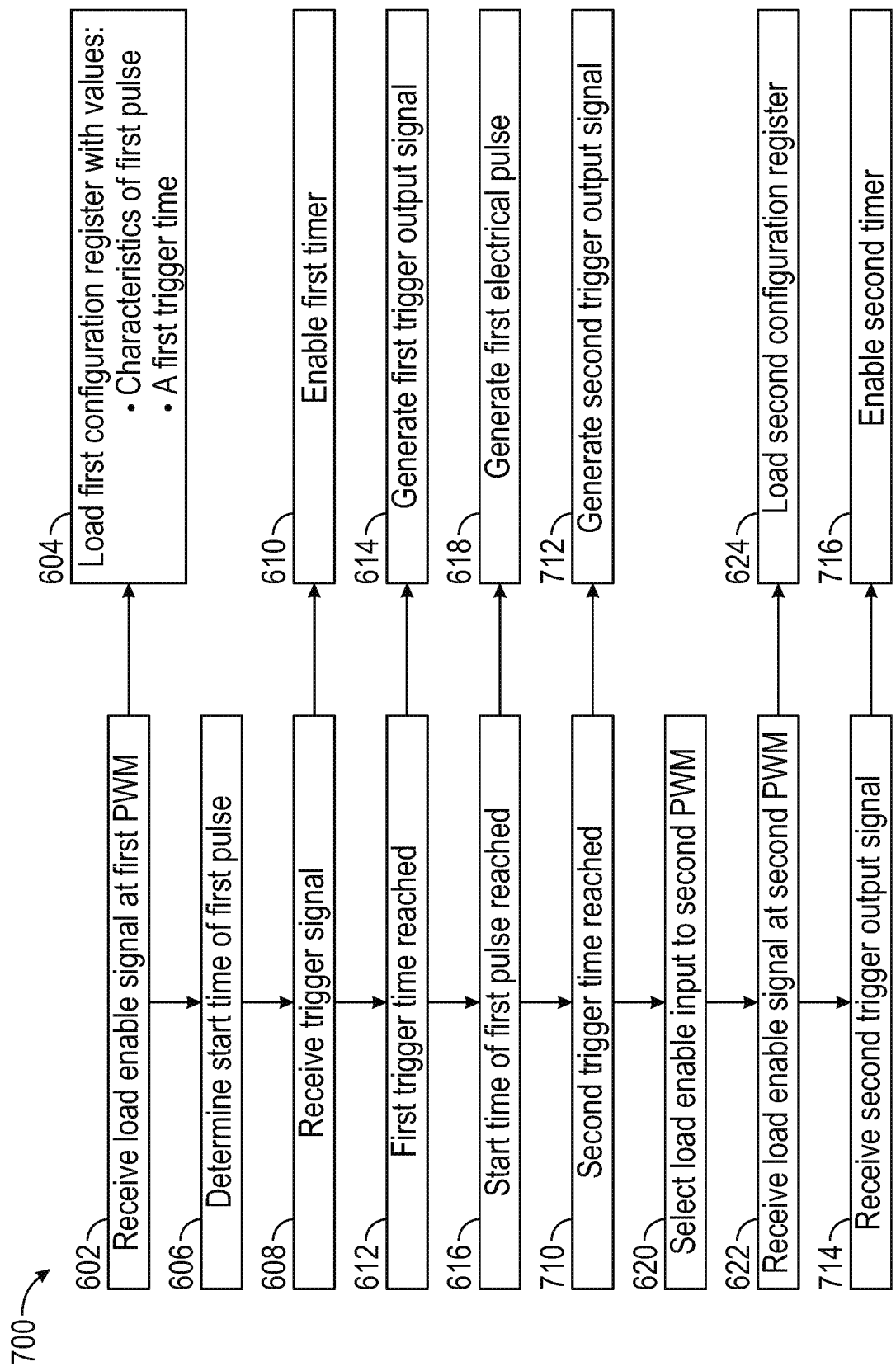
FIG. 7 is an illustration of a method for controlling PWM generators according to certain examples of the present disclosure.

FIG. 7 is an illustration of a method for controlling PWM generators according to certain examples of the present disclosure. Method 700 includes blocks described in reference to FIG. 6 and includes the following. At block 710, which may be subsequent to block 608 and before block 620, a comparator indicates the current clock cycle count of the first PWM generator matches a second trigger time defined by a configuration value, i.e., a second trigger timer is reached. At block 712, responsive to the indication of block 710, i.e., responsive to the second trigger time reached, the first PWM generator generates a second trigger output signal. At block 714, which may be subsequent to block 622, the second PWM generator receives the second trigger output signal generated at block 712. At block 716, responsive to the trigger received at block 714, the second PWM generator enables its internal timer, i.e., a second timer is enabled.

Figure 8:
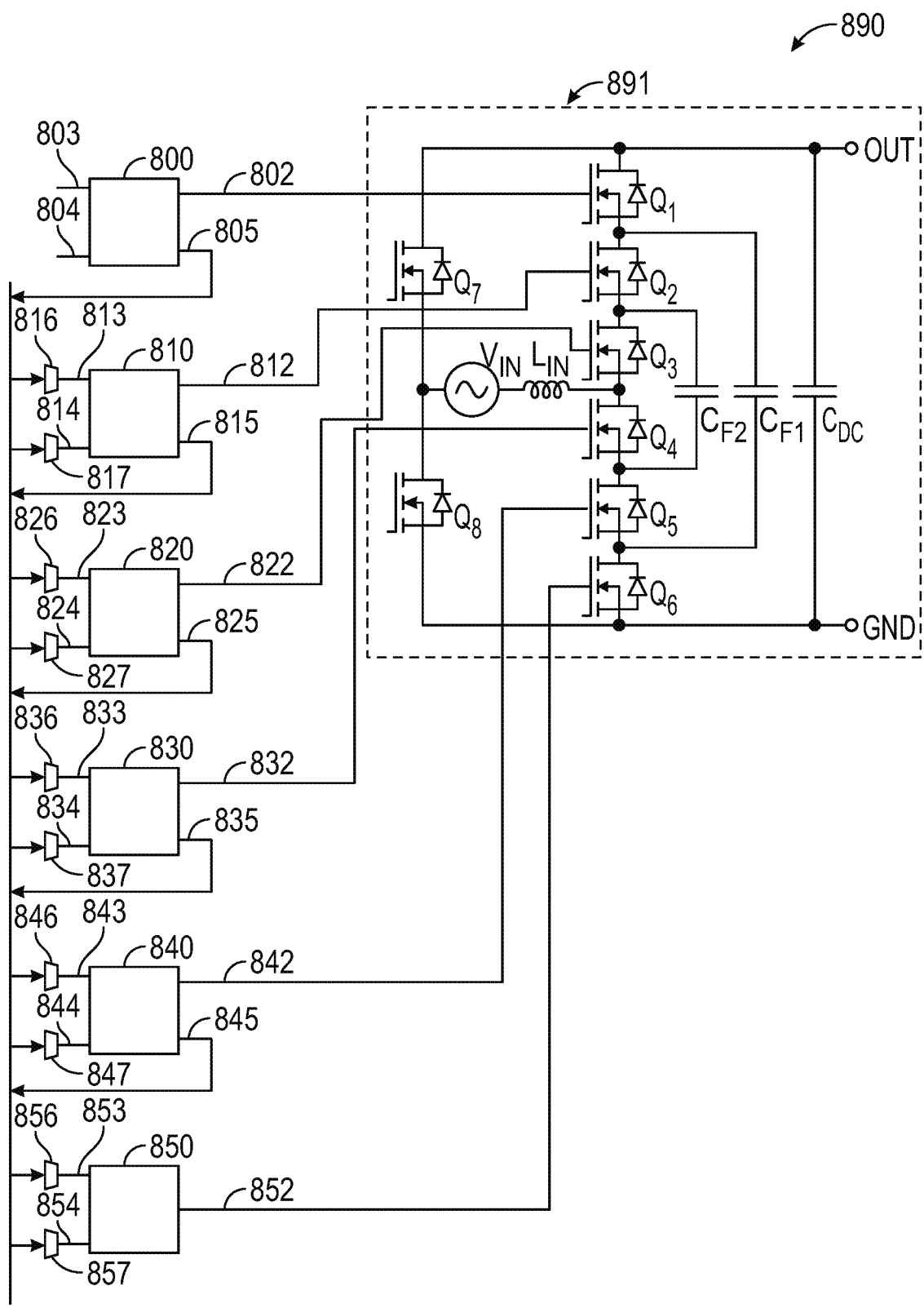
FIG. 8 is an illustration of an arrangement of PWM generators controlling a 4-level FLMC totem pole bridgeless PFV stage, according to certain examples of the present disclosure.

FIG. 8 is an illustration of an arrangement of PWM generators controlling a 4-level FLMC (fuzzy logic motor controller) totem pole bridgeless PFC (power factor compensation) stage, according to certain examples of the present disclosure. Circuit 890 includes 4-level FLMC totem pole bridgeless PFC stage 891 and PWM generators 800, 810, 820, 830, 840, and 850. Circuit 891 improves the performance of an electrical load by adjusting the power supplied to the electrical load.

The switches $Q_1$-$Q_6$ may have a particular sequence which allows charging of specific other elements such as the capacitors $C_{F2}$, $C_{F1}$, and $C_{DC}$. Input voltage $V_{IN}$ and series inductor LIN provide a power source to the circuit and switches $Q_7$ and $Q_8$ are controlled by other PWM generators, not shown. The charging and discharging of the capacitors $C_{F2}$, $C_{F1}$, and $C_{DC}$ may be synchronized and may be based upon input voltage $V_{IN}$ and output voltage at terminal OUT. Three complementary PWM signals are generated to control switches $Q_1$-$Q_6$.

PWM generator 800 operates as a lead PWM generator. PWM generator 800 generates a PWM signal on output 802 to control switch $Q_1$. PWM generator is configured via configuration enable input 803 and initiated via trigger input 804. PWM generator 800 generates a trigger signal on trigger output 805. PWM generator 850 generates a PWM signal output to control switch $Q_6$, which PWM signal to control switch $Q_6$ complementary to the PWM control signal to control switch $Q_1$. PWM generator 850 is configured via configuration enable input 853 and initiated via trigger input 854.

PWM generator 810 generates a PWM signal on output 812 to control switch $Q_2$. PWM generator 810 is configured via configuration enable input 813 and initiated via trigger input 814. PWM generator 810 generates a trigger signal on trigger output 815. PWM generator 840 generates a PWM signal output to control switch $Q_5$, which PWM signal to control switch $Q_5$ complementary to the PWM control signal to control switch $Q_2$. PWM generator 840 is configured via configuration enable input 843 and initiated via trigger input 844. PWM generator 840 generates a trigger signal on trigger output 845.

PWM generator 820 generates a PWM signal on output 822 to control switch $Q_3$. PWM generator 820 is configured via configuration enable input 823 and initiated via trigger input 804. PWM generator 801 generates a trigger signal on trigger output 805. PWM generator 830 generates a complementary PWM signal output to control switch $Q_4$, which PWM signal to control switch $Q_4$ complementary to the PWM control signal to control switch $Q_3$. PWM generator 830 is configured via configuration enable input 833 and initiated via trigger input 834. PWM generator 830 generates a trigger signal on trigger output 835.

In some examples, trigger output signals 805, 815, 825, 835, and 845 are available via input selectors 816, 826, 836, 846, 856 to enable a configuration update on PWM generators 810, 820, 830, 840, and 850. In some examples, trigger output signals 805, 815, 825, 835, and 845 are available via input selectors 817, 827, 837, 847, 857 to trigger counting in PWM generators 810, 820, 830, 840, and 850.

Figure 9:
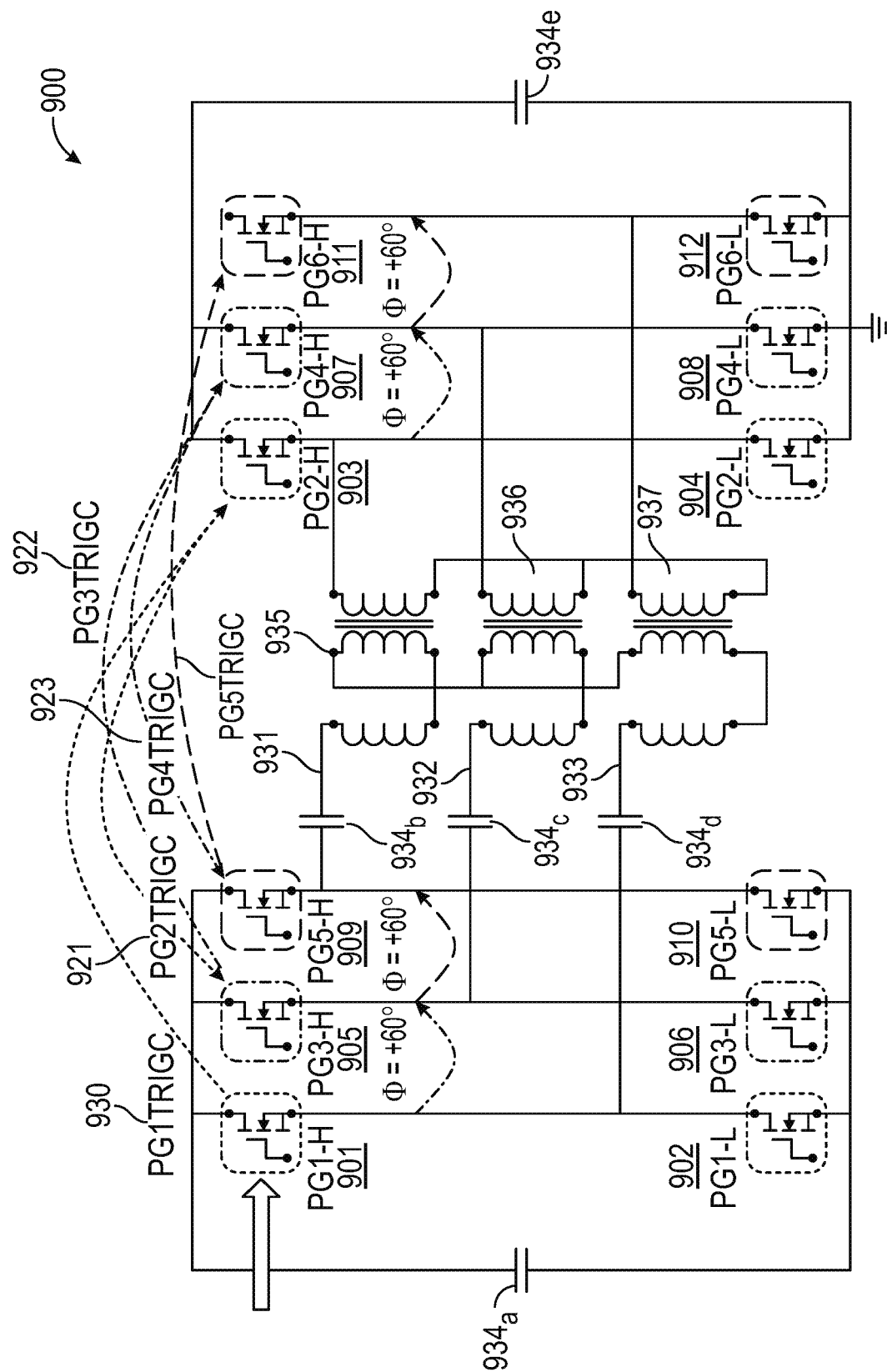
FIG. 9 is an illustration of an application of PWM generators according to certain examples of the present disclosure.

FIG. 9 is an illustration of an application of PWM generators according to certain examples of the present disclosure. Switches 901, 903, 905, 907, 909, and 911 are connected to the high side of a bridging circuit including transformers 935, 936, and 937 as well as capacitors 934a-e. Switches 902, 904, 906, 908, 910, and 912 are connected to the low side of the bridging circuit. Switch 901 is controlled by a first PWM generator (PG1-H) that is designated as a lead PWM generator and operates on a first phase of a three-phase circuit. Switches 903 and 905 operate on the other two phases of the three-phase circuit. PWM generators PG3-H and PG5-H follow and control switches 903 and 905, respectively. Similarly, switches 902, 904, 906, 908, 910, and 912 are controlled by PWM generators PG1-L to PG6-L. PG1-H is updated first and leads the updates. Update triggers PG1TRIGC through PG5TRIGC are illustrated as arrows between switches 901, 903, 905, 907, 909, and 911. Update triggers PG1TRIGC through PG5TRIGC may not be bound by the illustrated sequence. PG1TRIGC may be generated during the period of PG1-H and defined by a configuration register. PG1-H generates PG1TRIGC when a timer internal to PG1-H reaches the defined count for that trigger.

The three phases on each side of the bridge are each offset 60 degrees in this example. In some examples, the phases may be offset by 120 degrees. In some examples, the phase offset programmed into the PWM generators may be greater or less than 60 degrees. In some examples the cumulative offset value of a set of PWM generators may be greater than 360 degrees.

Figure 10:
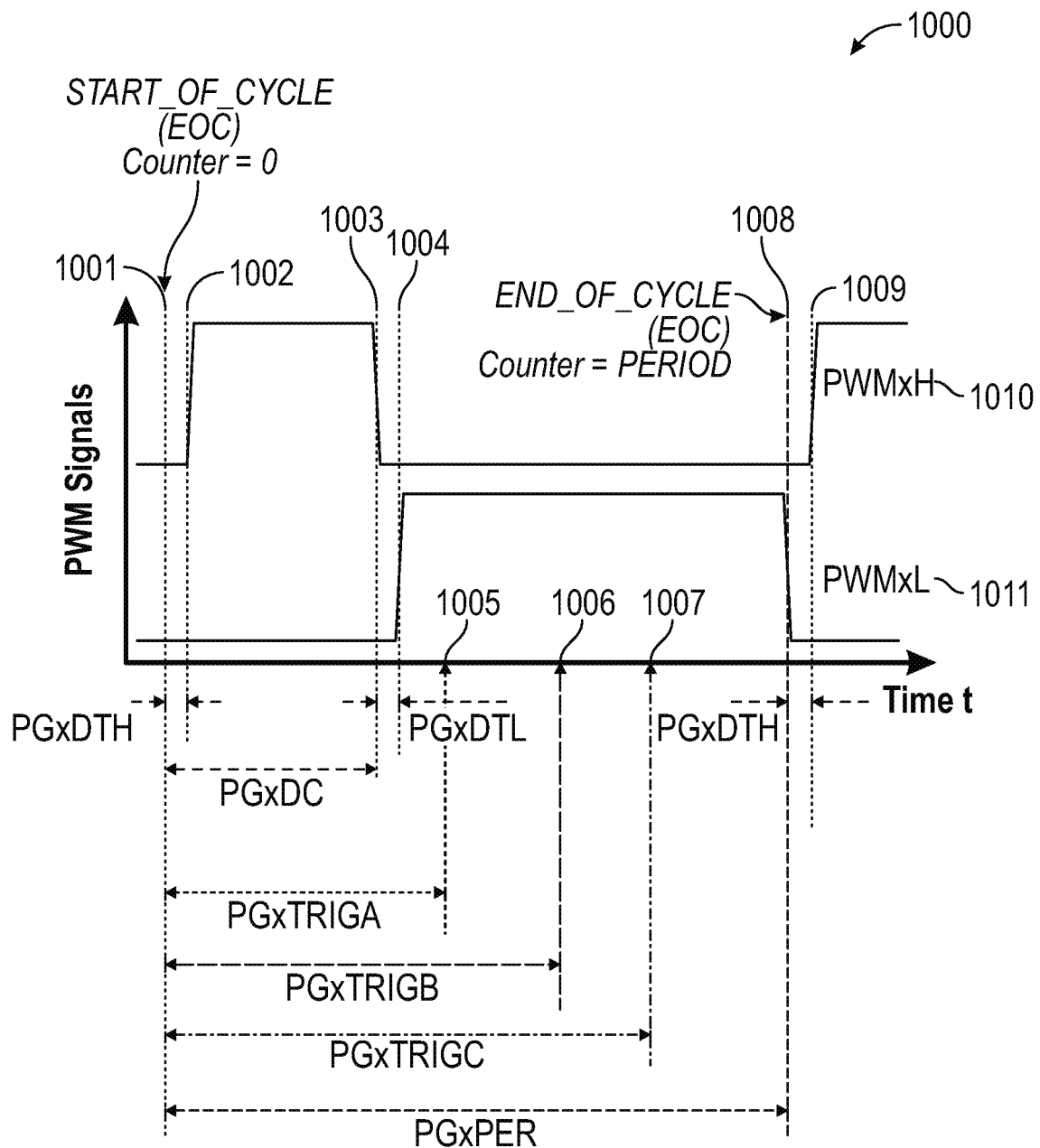
FIG. 10 is an illustration of a timing diagram of a PWM generator according to certain examples of the present disclosure.

FIG. 10 is an illustration of a timing diagram of a PWM generator according to certain examples of the present disclosure. Timing diagram 1000 illustrates PWM signals on the y-axis and time (t) on the x-axis. Signal 1010 may be a first PWM signal referred to as PWMxH. Signal 1011 may be a second PWM signal referred to as PWMxL. These signals may operate in a complementary manner.

In some examples, the timer operates with 250 picosecond resolution. In some examples, each PWM trigger generates three triggers. PGxTRIGA may have enhanced options. For example, PGxTRIGA may be delayed and shifted across multiple PWM cycles. In some examples, PGxTRIGA, PGxTRIGB, and PGxTRIGC may be available as an analog to digital conversion trigger. In some examples, PGxTRIGA, PGxTRIGB, and PGxTRIGC may be available for PWM synchronization. In some examples, PGxTRIGA, PGxTRIGB, and PGxTRIGC may be placed across the cycle independently. In some examples, the configuration values PGxDTH, PGxDC, PGxDTL, PGxTRIGA, PGxTRIGB, PGxTRIGC, and PGxPER may be defined in configuration registers and set when a configuration load enable signal is applied to the PWM generator. PGxDTH may specify a number of "dead time" cycles for the PWMxH signal. "Dead time" may be configured in to prevent simultaneous switching of high power switches controlled by the PWM generators. PGxDC may specify a number of duty cycles, or cycles to assert the PWMxH signal. PGxDTL may specify a number of "dead time" cycles for the PWMxL signal. PGxTRIGA, PGxTRIGB, and PGxTRIGC may specify each of three trigger cycle counts defining when each of three triggers will be asserted. PGxPER may specify a number of cycles for a repeating period for the PWM generator.

At time 1001, the PWM generator timer begins counting. Time 1001 may be referred to as START_OF_CYCLE and the counter may be reset to zero. At time 1002, signal PWMxH may begin rising to an asserted level. Time 1002 may be PGxDTH clock cycles from the start. In some examples, time 1002 may be the sum of register value PGxPHASE 122 and PGxDTH clock cycles from the start. At time 1003, signal PWMxH may begin falling to an unasserted level. Time 1003 may be PGxDC clock cycles from the start. At time 1004, signal PWMxL may begin rising to an asserted level. Time 1003 may be PGxDC plus PGxDTL clock cycles from the start. At time 1005, a trigger TRIGA may be asserted. Time 1005 may be PGxTRIGA clock cycles from the start. At time 1006, a trigger labeled TRIGB may be asserted. Time 1006 may be PGxTRIGB clock cycles from the start. At time 1007, a trigger labeled TRIGC may be asserted. Time 1007 may be PGxTRIGC clock cycles from the start. At time 1008, signal PWMxL may begin falling. Time 1008 may be PGxPER clock cycles from the start. At time 1008, the counter may be reset to zero and a new cycle may begin. At time 1009, signal PWM 1010 may begin rising again after PGxDTH cycles from time 1008.

In some examples, PGxPER is the limited window in which triggers and events may be generated for a PWM generator. In some examples, a PWM generator may include a second timer to allow triggers and events across multiple PWM cycles.

Figure 11:
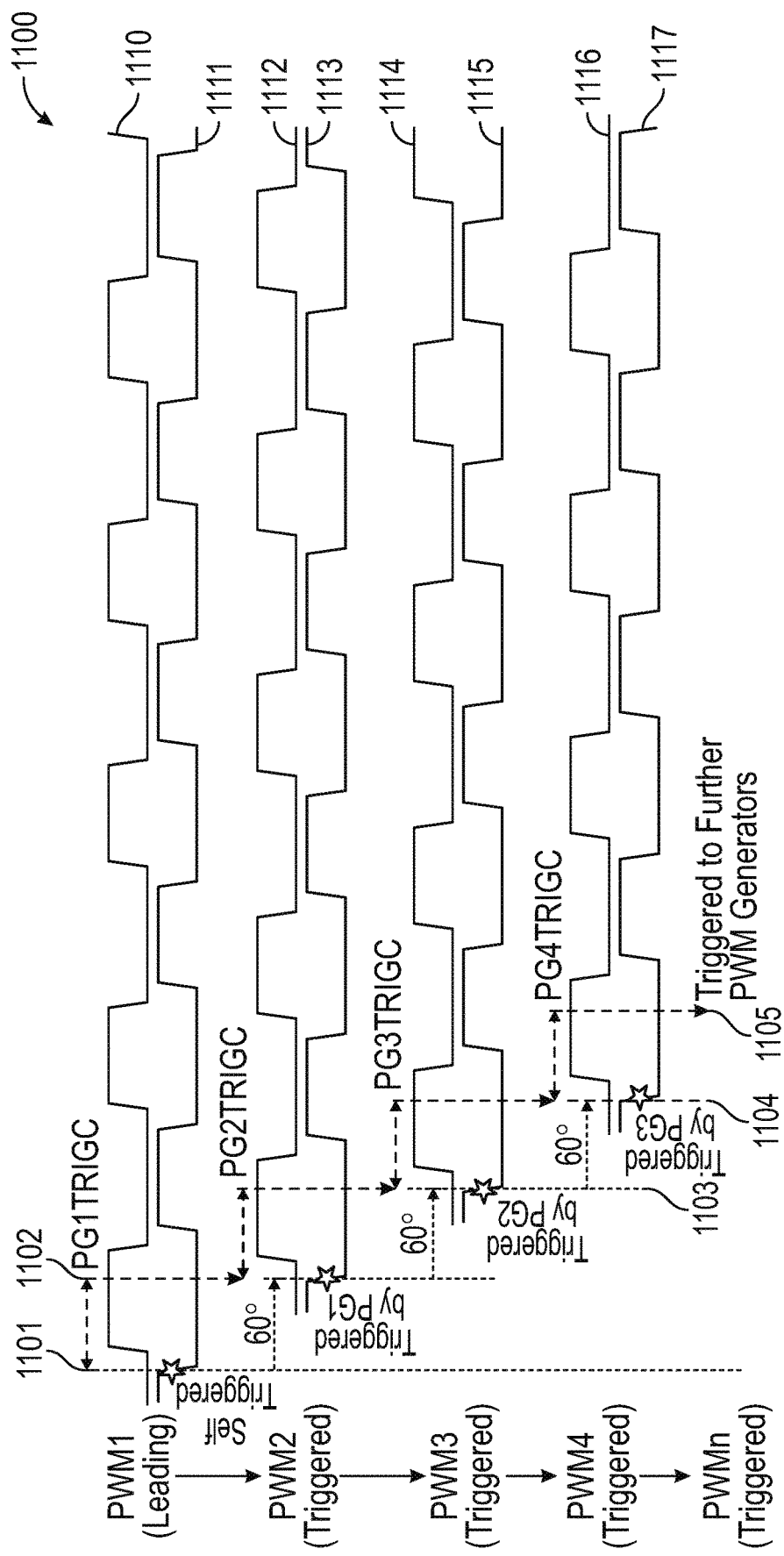
FIG. 11 is an illustration of a timing diagram of an arrangement of PWM generators according to certain examples of the present disclosure.

FIG. 11 is an illustration of a timing diagram of an arrangement of PWM generators according to certain examples of the present disclosure. At time 1101, PWM1 may be configured by a microprocessor and may be self-triggered as a leading PWM generator to begin its cycle generating complementary PWM signals 1110 and 1111. At time 1102, PWM1 may assert trigger PG1TRIGC to initiate PWM2 to generate complementary PWM signals 1112 and 1113, which may be sixty degrees out of phase from PWM signals 1110 and 1111. At time 1103, PWM2 may assert trigger PG2TRIGC to initiate PWM3 to generate complementary PWM signals 1114 and 1115, which may be sixty degrees out of phase from PWM signals 1112 and 1113. At time 1104, PWM3 may assert trigger PG3TRIGC to initiate PWM4 to generate complementary PWM signals 1116 and 1117, which may be sixty degrees out of phase from PWM signals 1114 and 1115. At time 1105, PWM4 may assert trigger PG4TRIGC to initiate other downstream PWM generators. In some examples, when the last channel is triggered, the first channel may have been updated.

Figure 12:
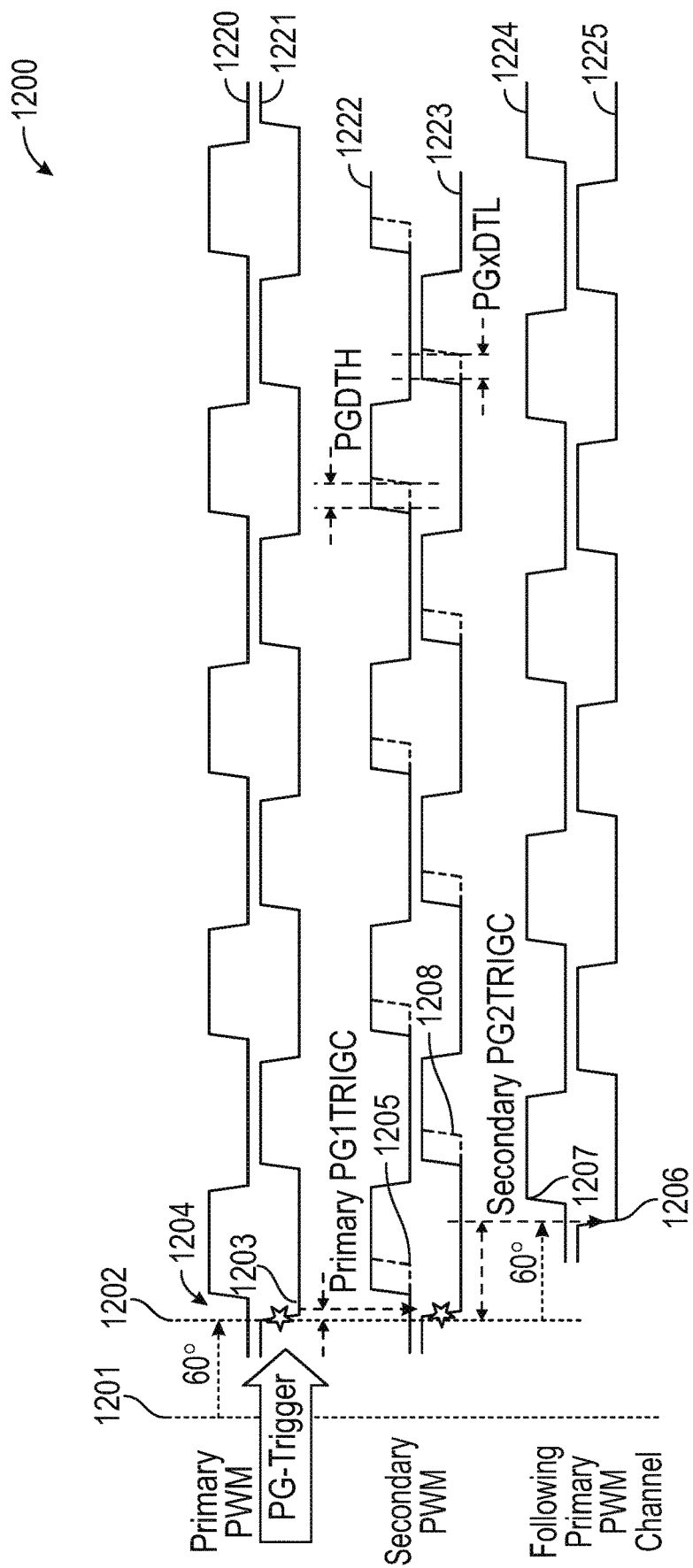
FIG. 12 is an illustration of a timing diagram of an arrangement of PWM generators according to certain examples of the present disclosure.

FIG. 12 is an illustration of a timing diagram of an arrangement of PWM generators according to certain examples of the present disclosure. In some examples, circuit may be controlled with synchronous rectifier PWM channels. A set of primary and secondary half-bridge drive PWM channels may be synchronized with simultaneous rising edges. In this example, the trigger cycle count for TRIGC of the primary PWM may be set to zero (or near zero, as illustrated) to trigger the secondary PWM at the start of cycle. At time 1201, the last phase of the last of a set of daisy-chained PWMs begins a cycle and the primary PWM generator stops asserting complementary PWM signal 1221. At time 1202, that last PWM triggers the primary PWM. At time 1203, which may be the same as time 1202, the primary PWM asserts trigger PG1TRIGC. In some examples, a delay between the primary and secondary PWM may be implemented through dead time configuration rather than delaying PG1TRIGC to synchronize the primary and secondary PWM generators. At time 1204, the primary PWM asserts signal 1220. At time 1205, the secondary PWM generator asserts signal 1222. At time 1206, the secondary PWM may assert trigger PT2TRIGC so as to phase shift the next power converter phase by 60 degrees. At time 1207, a following primary PWM channel asserts signal 1224.

In some examples the primary PWM trigger may be used to perform the phase shift. In these examples, the secondary PGxTRIGC trigger value may be reduced by the count of the phase shift delay. It is sometimes simpler to vary the pulse timing using dead time registers rather than trigger delays. This is illustrated with pulse delays 1205 and 1208 that delay pulses by PGxDTH and PGxDTL, respectively.

Figure 13:
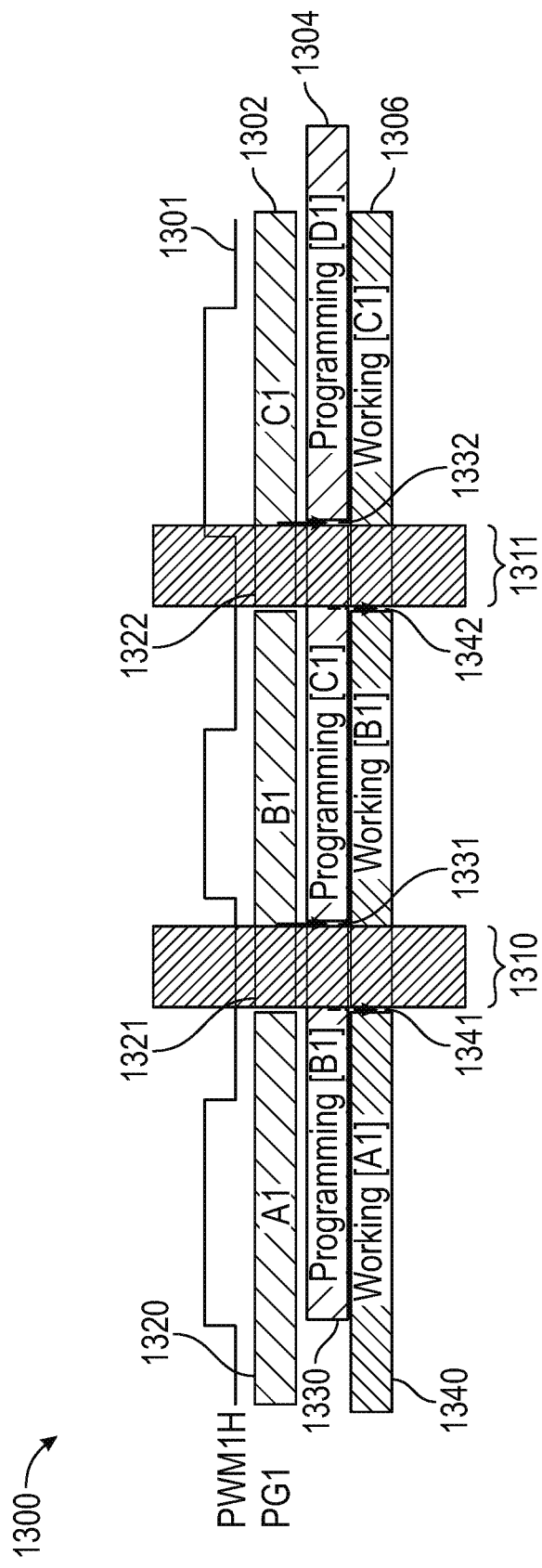
FIG. 13 is an illustration of a timing diagram of a PWM generator according to certain examples of the present disclosure.

FIG. 13 is an illustration of a timing diagram of a PWM generator according to certain examples of the present disclosure. Timing diagram 1300 illustrates the timing of programming and operation of a single channel PWM generator. Signal 1301 is the PWM output signal. Timing line 1302 illustrates three defined time periods A1, B1, and C1. Timing line 1304 illustrates three time periods for programming with values for defined time periods. Timing line 1306 illustrates three time periods for operating the PWM generator.

During time period 1320 (labeled "A1") the PWM generator is working during time period 1340 (labeled "Working [A1]") with configuration settings associated with A1 to generate PWM signal 1301. At time period 1330 (labeled "Programming [B1]"), the PWM generator loads new configuration settings for time period 1321 (labeled "B1"). During windows 1310 and 1311 a microprocessor performs a control loop execution cycle in which the microprocessor calculates the next set of program values. The start of window 1310 (or 1311) is a period boundary between periods A1 and B1 (or B1 and C1) and is the time at which working registers within the PWM generator are updated based on programmed values for period B1. The end of period 1310 (or 1311) is the time at which the microprocessor updates programming registers with a configuration for period B1 (or C1).

Figure 14:
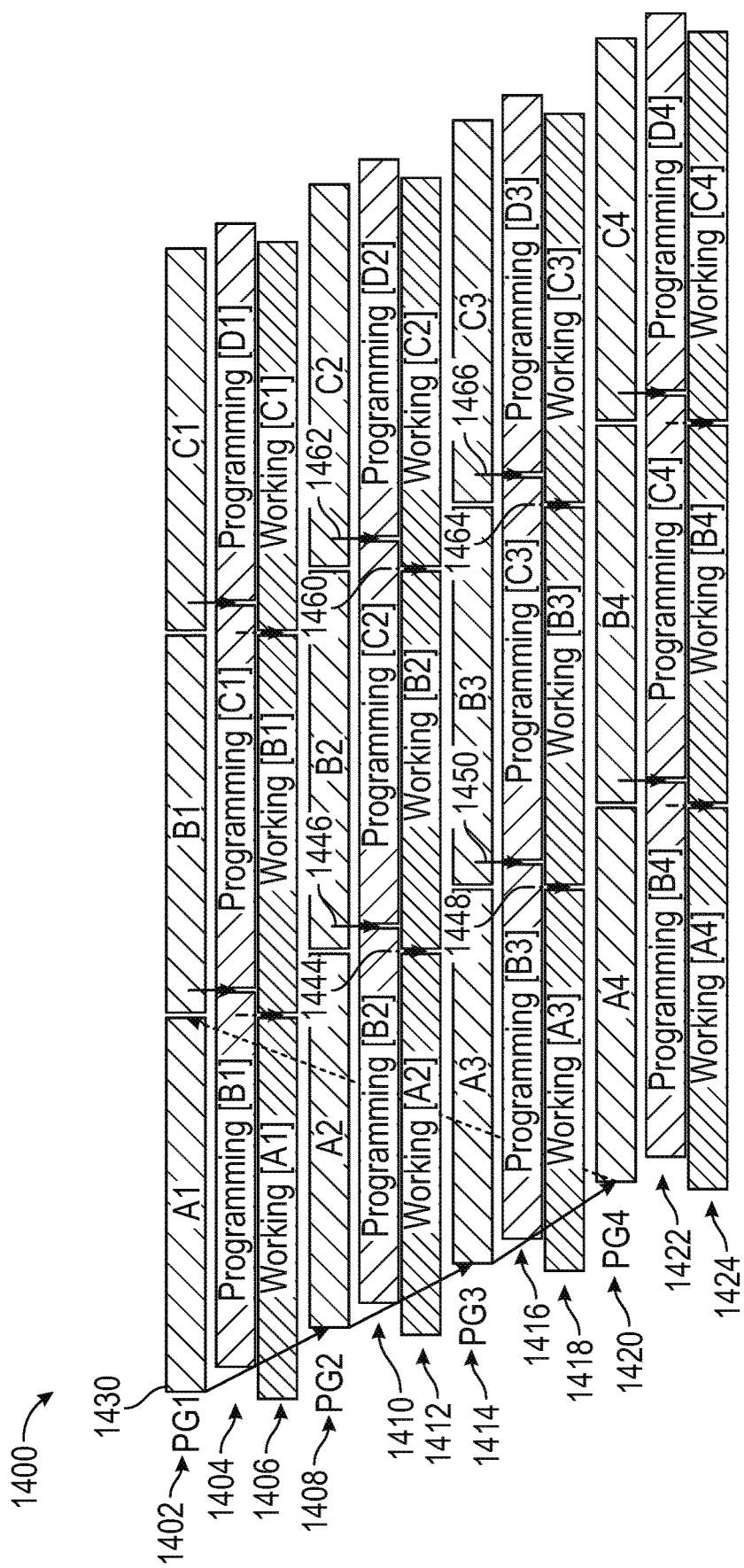
FIG. 14 is an illustration of a timing diagram of an arrangement of PWM generators according to certain examples of the present disclosure.

FIG. 14 is an illustration of a timing diagram of an arrangement of PWM generators according to certain examples of the present disclosure. Timing diagram 1400 illustrates the timing of a multi-phase PWM where each PWM generator cascades from the first with programming performed on a period boundary, as in FIG. 13.

Timing lines 1402, 1408, 1414, and 1420 provide labels for operational time periods for PWM generators PG1, PG2, PG3, PG4, respectively. Timing lines 1404 and 1406 illustrate timing lines for programming and operation of a first PWM generator, PG1. Timing lines 1410 and 1412 illustrate timing lines for programming and operation of a second PWM generator, PG2. Timing lines 1416 and 1418 illustrate timing lines for programming and operation of a third PWM generator, PG3. Timing lines 1422 and 1424 illustrate timing lines for programming and operation of a fourth PWM generator, PG4.

PG1, the lead PWM generator, triggers the operation of PG2, which in turn triggers the operation of PG3, and so forth. In this example, the programming steps in lines 1404, 1410, 1416, and 1422 are staggered to allow sequential programming by a microprocessor executing four individual control loops. The working steps in lines 1406, 1412, 1418, and 1424 are also staggered to follow the programming steps for the same timeframe. This staggering of programming steps and of working steps may be overly limiting in some applications and may require more control execution time than certain examples of the present disclosure.

Figure 15:
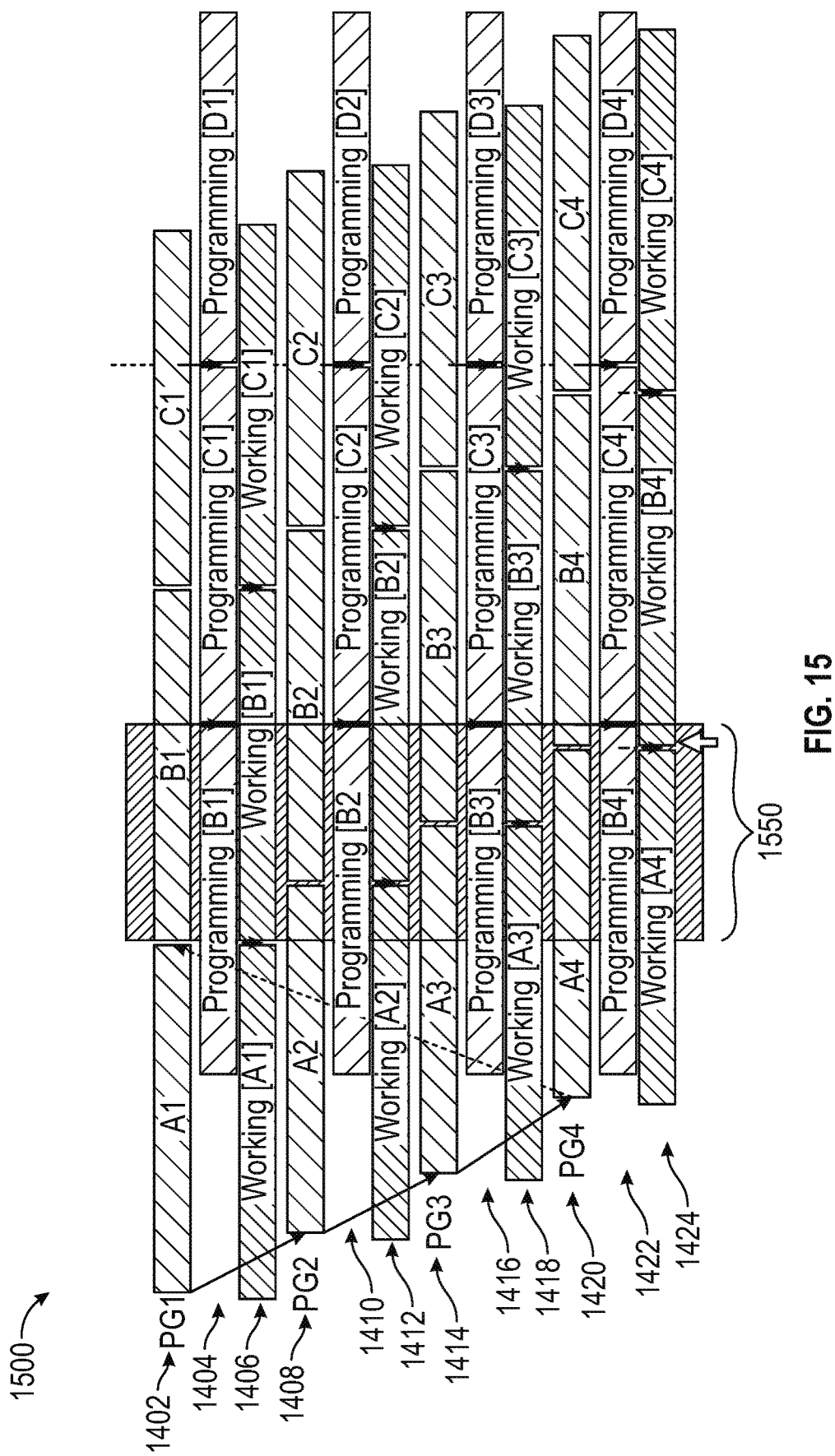
FIG. 15 is an illustration of a timing diagram of an arrangement of PWM generators according to certain examples of the present disclosure.

FIG. 15 is an illustration of a timing diagram of an arrangement of PWM generators according to certain examples of the present disclosure. Timing diagram 1500 illustrates a non-staggered programming process where programming steps B1, B2 B3, and B4 are simultaneous or nearly simultaneous and may be performed by a single control loop. Working stages B1, B2, B3, and B4 may be phased with cascading triggers from PG1 to PG2, PG2 to PG3, and PG3 to PG4. This sequence must be implemented with care to avoid programming PG4 with values for window B4 before working A4 has completed. In some examples, values may be loaded by the control loop into a buffer on each PWM generator and programmed into operating registers at the end of the current working window (i.e., at the end of cycle).

In some examples, new configuration values are stored during control loop 1550 in pre-allocated memory if earlier than the furthest trigger boundary. In these examples, PG4 may trigger a DMA at the boundary time (illustrated as a dashed arrow) to upload the register values and program PWM generators PG1-PG4 with values previously stored in pre-allocated memory. Because the total offset is within 360 degrees, one trigger per loop iteration is sufficient (i.e., periods B1 and B4 overlap).

Figure 16:
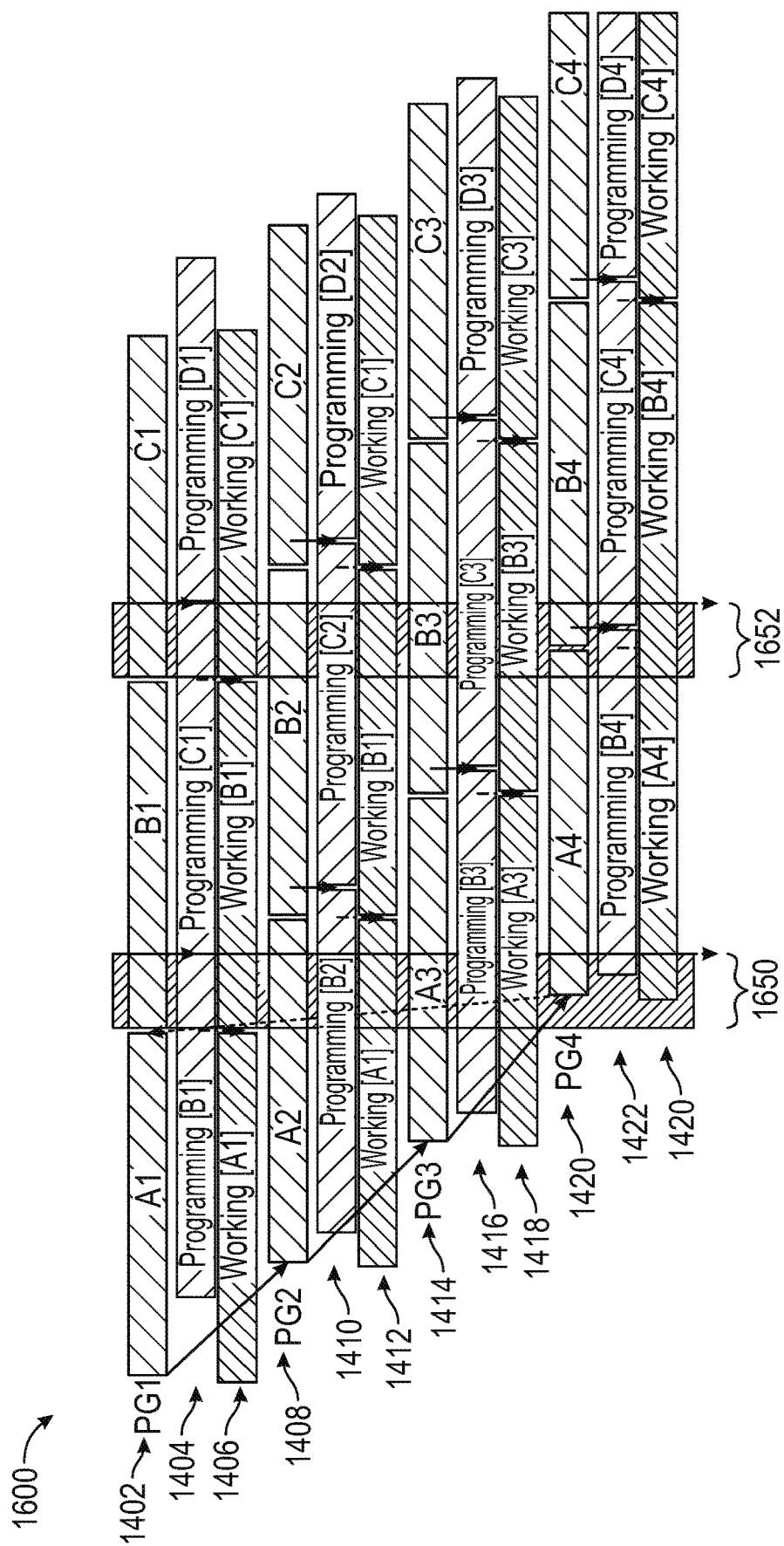
FIG. 16 is an illustration of a timing diagram of an arrangement of PWM generators according to certain examples of the present disclosure.

FIG. 16 is an illustration of a timing diagram of an arrangement of PWM generators according to certain examples of the present disclosure. Timing diagram 1600 illustrates a staggered programming and triggering sequence. At each control loop execution, the program configuration for PWM generator PG1 is loaded directly whereas the program configurations for PG2-PG4 are stored in memory. At each timing boundary, the preceding PWM generator triggers the DMA to bring in the program for the next PWM generator. For example, during control loop 1650, the microprocessor programs PG1 with program configuration C1. At some time later, as illustrated in timing line 1410, PG2 triggers the DMA to load PG2 configuration registers with program configuration C2. In line 1416, PG3 triggers the DMA to load PG3 configuration registers with program configuration C3. And in line 1420, PG4 triggers the DMA to load PG4 configuration registers with program configuration C4. In this example timing, PG4 cannot be responsible for triggering the program configuration of PG1-PG3 because PG4 is operating more than 360 degrees behind PG1 and close to 360 degrees behind PG2. In these examples, the microprocessor may perform other tasks while the daisy-chained PWM generators independently load and execute a set of three program configurations.

Figure 17:
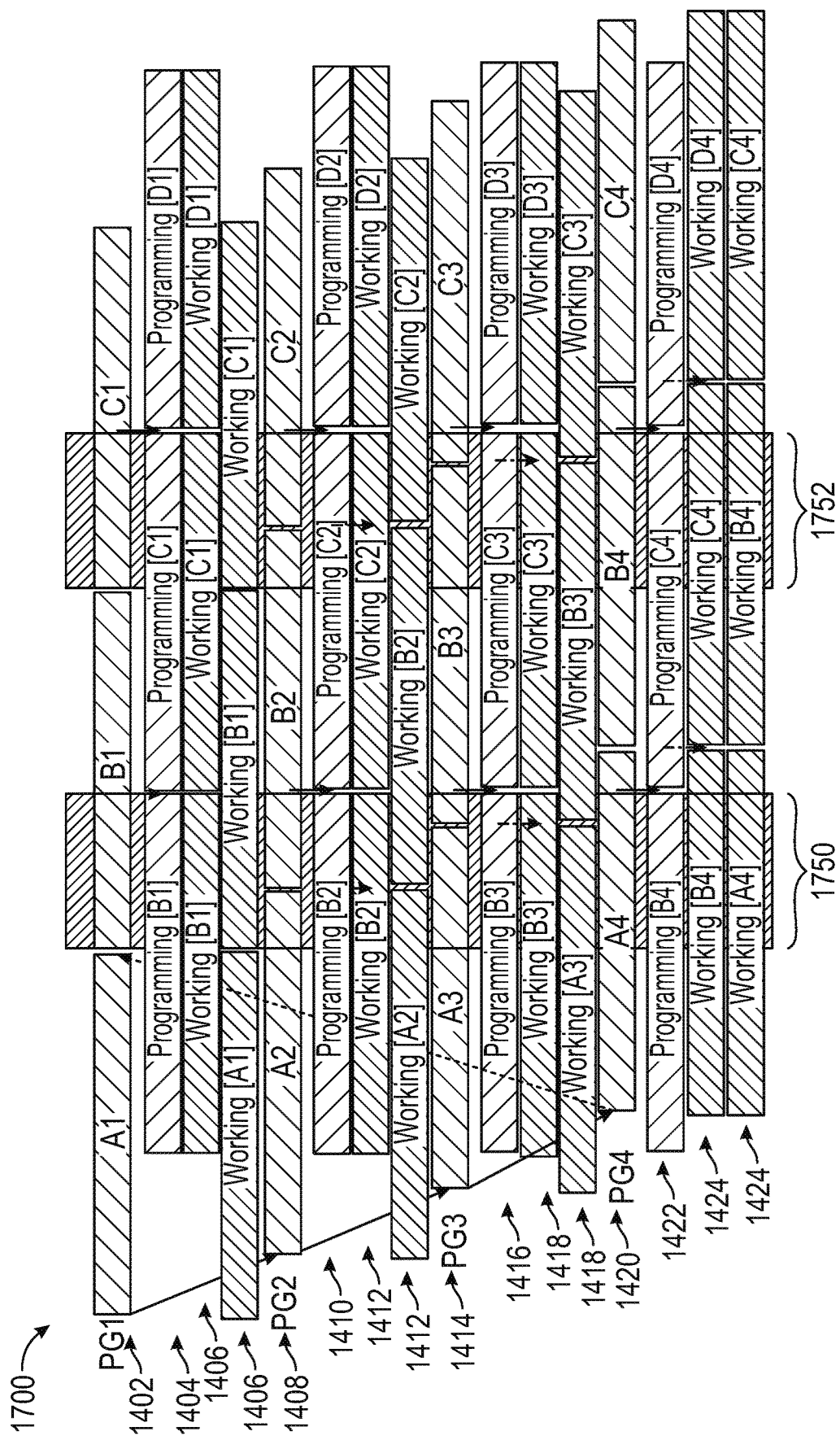
FIG. 17 is an illustration of a timing diagram of an arrangement of PWM generators according to certain examples of the present disclosure.

FIG. 17 is an illustration of a timing diagram of an arrangement of PWM generators according to certain examples of the present disclosure. Timing diagram 1700 illustrates a PWM with a second working layer. The second working layer in each PWM may be enabled by including an additional set of working registers. In some examples, an additional layer of buffers is provided to pipeline the configuration and operation of the PWMs. In line 1420, the A4 operation window coincides with a request to load the B4 program configuration. To enable this program timing an additional layer of configuration buffers may be provided to allow storage of B4 program configuration settings during execution under A4 program configuration settings. At the end of the A4 period, hardware within PG4 will automatically shift the B4 settings into the working registers at the transition to Working [B4] time window in line 1424.

In the example illustrated in FIG. 17, single control loop 1750 simultaneously writes to program PG1-PG4 with configurations C1-C4. In parallel with control loop 1750, PG1 shifts execution of its B1 configuration to its second execution slot. After a phase offset, each daisy chained PWM generator shifts execute of its B1 configuration to its second internal execution slot. The same process repeats with control loop 1752. This pipelined architecture provides additional timing flexibility for loading configurations.

Figure 18:
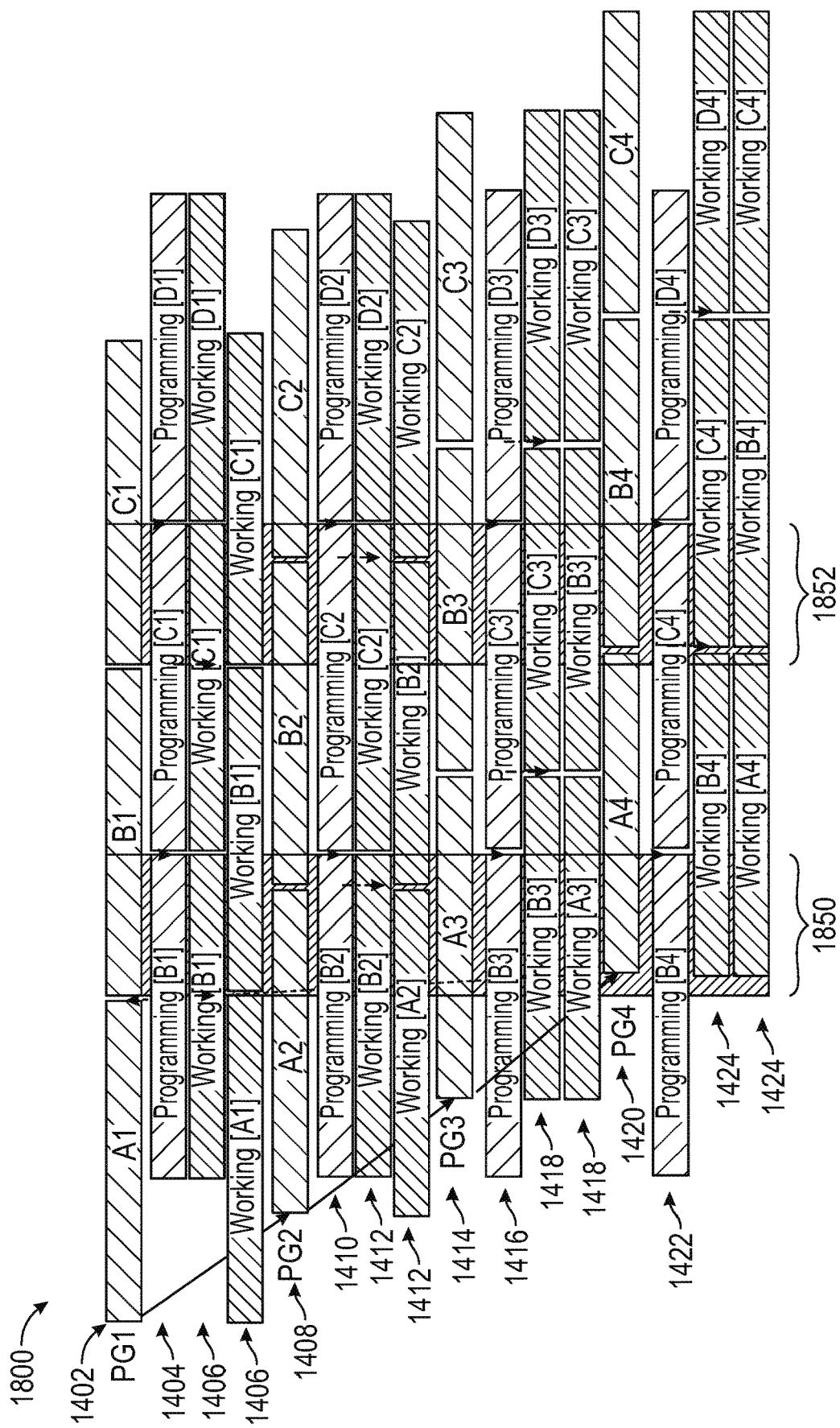
FIG. 18 is an illustration of a timing diagram of an arrangement of PWM generators according to certain examples of the present disclosure.

FIG. 18 is an illustration of a timing diagram of an arrangement of PWM generators according to certain examples of the present disclosure. Timing diagram 1800 illustrates an example where the offset may be greater than 360 degrees. Control loop 1850 loads PG1-PG4 with program configurations C1-C4. During that time window PG1 and PG2 begin executing under C1 and C2, respectively. PG3 begins executing C3 outside of the time window for control loop 1850 but before control loop 1852. The pipelined architecture implemented with the additional layer of configuration buffers supports operation with more than a 360 degree offset.

Although examples have been described above, other variations and examples may be made from this disclosure without departing from the spirit and scope of these examples.

We claim:

1. A circuit, including:
   a first pulse width modulation (PWM) generator circuit including:
      a first timer to generate a first cycle count,
      a first configuration register to define:
         characteristics of a first electrical pulse to be generated, and
         a trigger cycle count specifying a timing of a first trigger signal, and
      a first load enable input to load a new configuration value into the first configuration register;
   a second PWM generator circuit including:
      a second timer to generate a second cycle count,
      a second configuration register to define:
         characteristics of a second electrical pulse to be generated,
      a second load enable input to load a new configuration value into the second configuration register; and
   a load enable selector to selectively drive the second load enable input based on the first trigger signal.

2. The circuit of claim 1, including:
   a buffer to define characteristics of a third electrical pulse to be generated wherein upon assertion of the second load enable input, the second PWM generator circuit to:
      load the second configuration register from the buffer contents, and
      load the buffer with characteristics of a fourth electrical pulse to be generated.

3. The circuit of claim 1, including:
   a first buffer to define characteristics of a third electrical pulse to be generated, a second buffer to define characteristics of a fourth electrical pulse to be generated, wherein upon assertion of the second load enable input, the second PWM generator circuit to:
      load the second configuration register from the first buffer contents,
      load the first buffer contents from the second buffer, and
      load the second buffer with characteristics of a fifth electrical pulse to be generated.

4. The circuit of claim 1, wherein the characteristics of the second electrical pulse to be generated includes a specification in clock cycles of a period of the second electrical pulse, a timing in clock cycles of a rising edge of the second electrical pulse, and a timing in clock cycles of a falling edge of the second electrical pulse.

5. The circuit of claim 1, including:
   a first configuration buffer to load the first configuration register upon assertion of the first load enable input, and
   a second configuration buffer to load the second configuration register upon assertion of the second load enable input.

6. The circuit of claim 1, including:
the first configuration register defining a timing of a second trigger signal, and
the load enable selector to selectively drive the second load enable input based on the second trigger signal.

7. The circuit of claim 1, wherein first configuration register to define characteristics of the first electrical pulse to be generated includes:
a specification of a period of the first electrical pulse,
a specification of a phase of the first electrical pulse,
a specification of a duty cycle of the first electrical pulse, and
a specification of a dead time compensation of the first electrical pulse.

8. A circuit, including:
a first PWM generator circuit, including:
a first timer,
a first program enable to enable loading of a first program register,
a first trigger input to activate the first timer, and
a first plurality of trigger outputs, and
a second PWM generator circuit, including:
a second timer,
a second program enable input to enable loading of a second program register,
a second trigger input to activate the second timer, and
a second trigger input selector for selectively driving the second trigger input based on one of the first plurality of trigger outputs,
a first memory access channel to load the first program register, and
a second memory access channel to load the second program register.

9. The circuit of claim 8, including:
a third PWM generator circuit, including:
a third timer,
a third program enable to enable loading of a third program register,
a third trigger input to activate the third timer, and
a third trigger input selector for selectively driving the third trigger input based on one of the first plurality of trigger outputs or one of the second plurality of trigger outputs.

10. The circuit of claim 8, wherein the first program register defines, a period, a phase, and a duty cycle.

11. The circuit of claim 8, wherein the first program enable and second program enable may be asserted simultaneously.

12. The circuit of claim 8, wherein the first program register and the second program register are coupled to a memory bus.

13. The circuit of claim 8, wherein the first memory access controller to read values from a first buffer into the first program register and the second memory access controller to read values from a second buffer into the second program register.

14. A method including:
in response to a first load enable signal received at a first PWM generator:
loading a first configuration register with values defining:
characteristics of a first electrical pulse to be generated, and
a first trigger time, and
determining a start time of the first electrical pulse, and
in response to a first trigger signal on a first trigger input, enabling a first timer to begin counting,
in response to the first timer counting to the first trigger time, generating a first trigger output signal on a first trigger output,
in response to the first timer counting to the start time of the first electrical pulse, generating a first electrical pulse,
selecting a second load enable input to a second PWM generator from a plurality of selectable inputs including the first trigger output, and
in response to a second load enable input signal received at the second load enable input, loading a second configuration register of the second PWM generator with values defining characteristics of a second electrical pulse to be generated.

15. The method of claim 14, including:
in response to the first timer counting to a second trigger time, generating a second trigger signal,
in response to the second trigger signal, enabling a second timer of the second PWM generator to begin counting.

16. The method of claim 14, including:
selecting the first trigger input as the second load enable input to the second PWM generator, and
in response to the first trigger input signal, loading the second configuration register with values defining characteristics of a second electrical pulse to be generated.

17. The method of claim 16, wherein loading the first configuration register receives configuration values from a first buffer and loading the second configuration register receives configuration values from a second buffer.

18. The method of claim 16, wherein loading the first configuration register receives configuration values from a first direct memory access (DMA) channel and loading the second configuration register receives configuration values from a second DMA channel.

19. The method of claim 14, wherein the first PWM generator operates on a first period and the second PWM generator operates on a second period, the method including:
a processor storing in a memory:
the values defining the plurality of characteristics of the first electrical pulse to be generated, and
the values defining characteristics of a second electrical pulse to be generated, and
at the start of the first period, triggering a DMA controller to retrieve the values defining the plurality of characteristics of the first electrical pulse to be generated,
at the start of the second period, triggering the DMA controller to retrieve the values defining the characteristics of a second electrical pulse to be generated.

20. The method of claim 19, wherein triggering the DMA controller in each instance occurs independent of the execution of the processor.

* * * * *